(12) United States Patent
Kim et al.

(10) Patent No.: US 11,658,389 B2
(45) Date of Patent: May 23, 2023

(54) SYSTEM AND METHOD FOR A SHARED MILLIMETER WAVE ANTENNA SYSTEM CO-LOCATED AT A SPEAKER GRILL

(71) Applicant: Dell Products, LP, Round Rock, TX (US)

(72) Inventors: Changsoo Kim, Cedar Park, TX (US); Suresh K. Ramasamy, Cedar Park, TX (US); Timothy C. Shaw, Austin, TX (US); Geroncio O. Tan, Austin, TX (US)

(73) Assignee: Dell Products, LP, Round Rock, TX (US)

( * ) Notice: Subject to any disclaimer, the term of this patent is extended or adjusted under 35 U.S.C. 154(b) by 0 days.

(21) Appl. No.: 17/717,911

(22) Filed: Apr. 11, 2022

(65) Prior Publication Data

US 2022/0238983 A1     Jul. 28, 2022

Related U.S. Application Data

(63) Continuation of application No. 16/777,896, filed on Jan. 31, 2020, now Pat. No. 11,303,008.

(51) Int. Cl.
| | |
|---|---|
| *H01Q 1/24* | (2006.01) |
| *H01Q 1/22* | (2006.01) |
| *H01Q 21/06* | (2006.01) |
| *H05K 1/18* | (2006.01) |
| *H01Q 13/10* | (2006.01) |
| *H04R 1/02* | (2006.01) |

(52) U.S. Cl.
CPC .............. *H01Q 1/2266* (2013.01); *H01Q 1/24* (2013.01); *H01Q 13/10* (2013.01); *H01Q 21/065* (2013.01); *H04R 1/023* (2013.01); *H05K 1/181* (2013.01); *H04R 2499/15* (2013.01); *H05K 2201/10098* (2013.01)

(58) Field of Classification Search
CPC ........ H01Q 1/2266; H01Q 1/24; H01Q 13/10; H01Q 21/065; H04R 1/023; H05K 1/181
See application file for complete search history.

(56) References Cited

U.S. PATENT DOCUMENTS 10,862,190 B1 * 12/2020 Ramasamy ........... G06F 1/1688

* cited by examiner

*Primary Examiner* — Joseph J Lauture
(74) *Attorney, Agent, or Firm* — Prol Intellectual Property Law, PLLC; H. Kenneth Prol

(57) ABSTRACT

An information handling system to wirelessly transmit and receive data may include a base chassis including a processor, a memory, and a wireless adapter; a metal C-cover of the base chassis to house a speaker grill, the speaker grill covering a speaker to emit audio waves; the speaker grill formed within the C-cover, the speaker grill including a slot formed around a portion of a perimeter of the speaker grill that physically separates the portion of the speaker grill as a peninsula in the C-cover; a millimeter wave antenna element coupled to a back side of the speaker grill; and a sub-6 GHz antenna element to transmit via the slot formed around the perimeter of the speaker grill; wherein the speaker grill has a mesh pattern of grill openings sized to be transparent to millimeter wave frequencies emitted by the millimeter wave antenna element.

20 Claims, 8 Drawing Sheets

SYSTEM AND METHOD FOR A SHARED MILLIMETER WAVE ANTENNA SYSTEM CO-LOCATED AT A SPEAKER GRILL

This application is a continuation of prior application Ser. No. 16/777,896 entitled "SYSTEM AND METHOD FOR A SHARED MILLIMETER WAVE ANTENNA SYSTEM CO-LOCATED AT A SPEAKER GRILL," filed on Jan. 31, 2020, which is assigned to the current assignee hereof and is incorporated herein by reference in its entirety.

FIELD OF THE DISCLOSURE

The present disclosure generally relates to information handling systems, and more particularly relates to an information handling system including a millimeter wave antenna system and other antenna systems co-located at a speaker grill.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, read-only memory (ROM), and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components. The information handling system may also include telecommunication, network communication, and video communication capabilities. The information handling system may also include one or more buses operable to transmit communications between the various hardware components. The information handling system may also include telecommunication, network communication, and video communication capabilities. Information handling system chassis parts may include case portions such as for a laptop information handling system including the C-cover over components designed with a metal structure. The information handling system may be configurable with a millimeter antenna system co-located with a speaker grill of a C-cover chassis.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings may indicate similar or identical items.

DETAILED DESCRIPTION OF THE DRAWINGS

Figure 1:
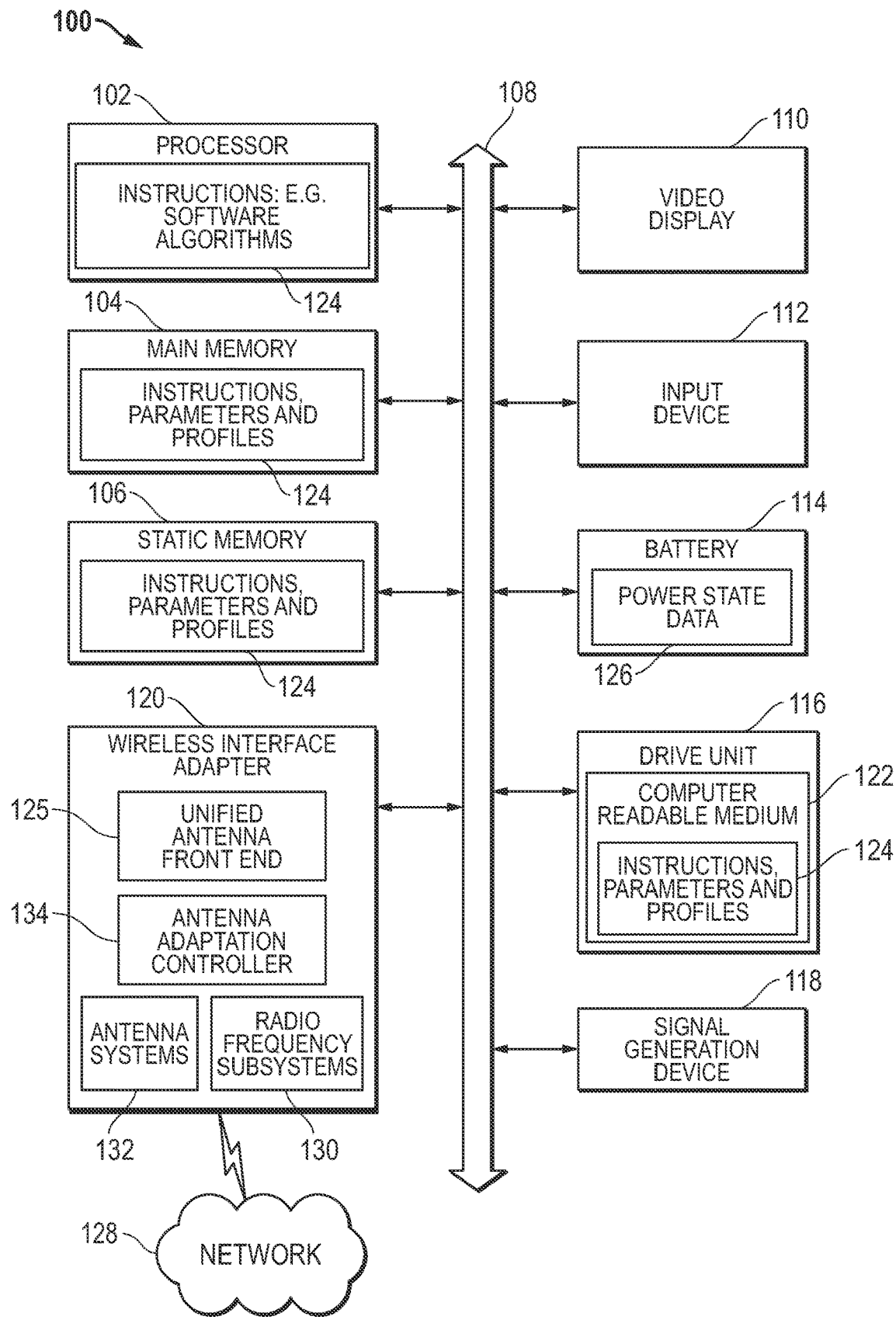
FIG. 1 illustrates an embodiment of information handling system according to an embodiment of the present disclosure.

The following description in combination with the Figures is provided to assist in understanding the teachings disclosed herein. The description is focused on specific implementations and embodiments of the teachings, and is provided to assist in describing the teachings. This focus should not be interpreted as a limitation on the scope or applicability of the teachings.

For aesthetic, strength, and performance reasons, information handling system chassis parts are more commonly designed with a metal structure or milled carbon fiber (CMF) chassis made of, for example, carbon fiber. In an embodiment, a laptop information handling system, for example, may include a plurality of covers for the interior components of the information handling system. In these embodiments, a form factor case may include an "A-cover" which serves as a back cover for a display housing or display chassis and a "B-cover" which may serve as the bezel, if any, and a display screen of the laptop information handling system in an embodiment. In a further example, the laptop information handling system case may include a "C-cover" housing a keyboard, touchpad, speaker grill, and any cover in which these components are set and a "D-cover" base housing or base chassis for the laptop information handling system. In an embodiment, the information handling system may be a convertible laptop information handling system.

With the need for utility of lighter, thinner, and more streamlined devices, the use of full metal portions for the outer covers of the display and base housing (e.g. the A-cover and the D-cover) is desirable for strength as well as aesthetic reasons. At the same time, the demands for wireless operation also increase. This includes addition of many concurrently operating radiofrequency (RF) systems, addition of more antennas, and utilization of various antenna types. However, the thinner and more streamlined devices have fewer locations and area available for mounting RF transmitters on these mobile information handling systems. One location within the information handling system where these RF systems and antennas are being located are the C-cover and D-covers. The placement of the RF systems and antennas out of the A-cover and B-cover and into the -cover and D-covers are a result of the increase in size of a display device placed within the B-cover, causing the RF systems and antennas to be placed within the C-cover or D-cover of the information handling systems. In other aspects, current information handling systems require a plurality of antenna systems for several wireless protocol capabilities. Limited location on the information handling system causes the antenna to be located in the C-cover and D-cover.

Another consequence of using metal covers is the excitation of the metal surfaces of the covers described herein. This excitation of the metal surfaces leads to destructive interference in the signals sent by the antenna systems. Thus, a streamlined, full metal chassis capable of meeting the increasing wireless operation demands is needed while also providing for efficient use of space to accommodate plural antenna systems.

Some information handling systems would address these competing needs by providing for cutout portions of a metal outer chassis cover filled with plastic behind which RF transmitters/receivers would be mounted. The cutouts to accommodate radio frequency (RF) transmitters/receivers are often located in aesthetically undesirable locations and required additional plastic components to cover the cutout, thus not fully meeting the streamlining needs. The plastic components added a component to be manufactured and were required to be seamlessly integrated into an otherwise smooth metal chassis cover to achieve a level of aesthetics. Further, the plastic portions included may be expensive to machine, and may require intricate multi-step processes for integrating the metal and plastic parts into a single chassis. This requirement could require difficult and expensive processes to manufacture with a less aesthetically desirable result.

In addition, in the case of the convertible laptop information handling system, 180-degree or even 360 degree configurability may be a feature available to a user during use. Thus, often an antenna such as an aperture antenna system would be located at the top (e.g. A-cover) with a plastic antenna window in a metal chassis cover to radiate in a closed mode, or at the bottom (e.g. C-cover) to radiate in an open mode. Such a configuration could make the display panel housing (e.g. A-cover) or the base panel housing (e.g. C-cover) thicker, to accommodate antennas and cables behind the plastic panel at the top (or bottom) of either housing. Overall, an addition of a plastic antenna window in an A-cover or C-cover may not meet the streamlining or aesthetics needs.

Embodiments of the present disclosure may decrease the complexity and cost of creating chassis for information handling systems by forming the outer chassis (e.g. the A-cover or the D-cover) of metal and implementing a speaker grill with a portion of its perimeter that has been physically and operatively disassociated from the C-cover via a slot formed through the C-cover. In some embodiments, an antenna element may be operatively coupled to the slot formed along the perimeter of the speaker grill so as to cause the speaker grill to radiate or an antenna maybe implemented in or operatively coupled to a portion of the slot. In the same or other embodiments, the speaker grill may have a millimeter wave antenna element coupled to a back side of the speaker grill. The speaker grill may allow for the transmission of millimeter wave frequencies to pass through a mesh pattern formed on the speaker grill. The mesh pattern may be an array of holes formed in the speaker grill and sized and spaced with a pitch to allow millimeter wave RF signals to pass through as well as audio waves. In these embodiments, the co-location of an antenna element (e.g., a millimeter wave antenna element and/or a sub-6 GHz antenna element) with the speaker grill and speaker therein decreases the size of the information handling system by using space within the speaker cavity behind the speaker grill for the transmission of RF EM waves as well as audio waves. Additionally, the placement of the antenna element behind the speaker grill at a location by a speaker provides for accommodating more antenna systems in the information handling system or even for freeing additional space at the display chassis to expand the size of any video display device of the information handling system. This increases the usability of the information handling system by freeing chassis room for other devices while increasing the type and number of antenna elements used to transmit RF EM waves. In embodiments where the information handling system is to communicate with a wider network, the RF EM signals may be directed towards the horizon from the speaker grill in the C-cover, thus increasing the efficiency of data transmission between the information handling system and any access point.

The metal chassis in embodiments described herein may include a hinge operably connecting the A-cover to the D-cover such that the keyboard, touchpad, and speaker grill enclosed within the C-cover and attached to the D-cover may be placed in a plurality of configurations with respect to the digital display enclosed within the B-cover and attached to the A-cover. The plurality of configurations may include, but may not be limited to, an open configuration in which the A-cover is oriented at a right or obtuse angle from the D-cover (similar to an open laptop computer) and a closed configuration in which the A-cover lies substantially parallel to the D-cover (similar to a closed laptop computer), or other orientations. Despite these different configurations, however, the antenna elements co-located with a speaker grill and its speaker provides for the streamlining of the information handling system without compromising the ability of the antenna element to transmit and receive data from and to the information handling system especially in an open configuration for example.

Manufacture of embodiments of the present disclosure may involve fewer extraneous parts than previous chassis by forming the exterior or outer portions of the information handling system, including the bottom portion of the D-cover and the top portion of the A-cover, from metal. In order to allow for manufacture of fully or nearly fully metallic outer chassis including the A-cover and the D-cover, embodiments of the present disclosure create a form factor case enclosing the information handling system such that one or more transmitting antennas within the speaker grill are integrated into the C-cover of the information handling system.

Such a method of placing the antenna element at the speaker grill of the form factor case may reduce the need for the integration of any RF transparent plastic windows within the exterior of the A-cover, B-cover, C-cover, or the D-cover, thus decreasing the complexity and cost of manufacture. According to some embodiments of the present disclosure, a plastic trim ring may be used to visually hide a slot formed around the speaker grill after the portion of the speaker grill has been physically and operative decoupled from the C-cover. The inclusion of this plastic trim ring increases the aesthetic characteristics of the information handling system while providing for a resonating sub-6 GHz antenna element along with the millimeter wave antenna element. The antenna elements may then effectively transmit communications signal perpendicularly from the surface of the C-cover.

In embodiments described herein, the antenna element may be excited using a wireless interface adapter that includes an antenna front end. The antenna front end may, in the embodiments presented herein, be operatively coupled to the antenna element to excite the antenna element in order to cause the antenna element to emit one or a plurality of frequencies based on the target frequency or a plurality of target frequencies. In an embodiment, the antenna front end may be formed on a printed circuit board (PCB). In this embodiment, the PCB may be coupled to an interior surface of the C-cover and within a cavity formed behind the speaker grill. The antenna front end may be communicatively coupled to a millimeter wave antenna which is coupled to a back surface of the speaker grill.

In the embodiments described herein, the speaker grill may have a number of holes formed therein that are sized and space to be RF transparent to the frequencies emitted by the millimeter wave antenna element. In an embodiment, the holes may be formed into the speaker grill having a pitch of 1 mm by 1 mm. In the present specification and in the appended claims, the term "pitch" is meant to be understood as a distance between successive corresponding points such as the distance between successive corresponding holes defined in the speaker grill. The pitch of the holes formed into the speaker grill may allow for both audio waves originating from the speaker and millimeter RF waves emitted by the millimeter wave antenna element.

In embodiments described herein, the speaker grill may be flush with a surface of the C-cover, which is a surface most likely to be visible to the user. In such embodiments, the plastic trim ring may be visually innocuous to the user while preventing objects from passing through the slot formed between the speaker grill and the remainder of the C-cover. Still further, the plastic trim ring may be held within the slot through the use of an undercut formed by the slot and the remaining border of the speaker grill that prevents the plastic trim ring from being removed. Because the plastic trim ring is made of plastic, any RF EM waves may be passed therethrough during operation of the information handling system while still preventing foreign objects from entering the C-cover via the slot formed. In some embodiments, a sub-6 GHz antenna may be formed to operate at a portion of the slot of the speaker grill as described.

Examples are set forth below with respect to particular aspects of an information handling system including case portions such as for a laptop information handling system including the chassis components designed with a fully metal structure and configurable such that the information handling system may operate in any of several usage mode configurations.

FIG. 1 shows an information handling system 100 capable of administering each of the specific embodiments of the present disclosure. The information handling system 100, in an embodiment, can represent the mobile information handling systems 210, 220, and 230 or servers or systems located anywhere within network 200 described in connection with FIG. 2 herein, including the remote data centers operating virtual machine applications. Information handling system 100 may represent a mobile information handling system associated with a user or recipient of intended wireless communication. A mobile information handling system may execute instructions via a processor, such as a microcontroller unit (MCU), operating both firmware instructions or hardwired instructions for the antenna adaptation controller 134 to achieve WLAN or WWAN antenna optimization according to embodiments disclosed herein. The application programs operating on the information handling system 100 may communicate or otherwise operate via concurrent wireless links, individual wireless links, or combinations over any available radio access technology (RAT) protocols including WLAN protocols. These application programs may operate in some example embodiments as software, in whole or in part, on an information handling system while other portions of the software applications may operate on remote server systems. The antenna adaptation controller 134 of the presently disclosed embodiments may operate as firmware or hardwired circuitry or any combination on controllers or processors within the information handing system 100 for interface with components of a wireless interface adapter 120. It is understood that some aspects of the antenna adaptation controller 134 described herein may interface or operate as software or via other controllers associated with the wireless interface adapter 120 or elsewhere within information handling system 100. In an embodiment, the antenna adaptation controller 134 may control an amount of current at a voltage to be sent to an antenna element (e.g., a millimeter wave antenna element and/or a sub-6 GHz antenna element) co-located with a speaker grill formed within the C-cover of the information handling system as described herein. The antenna adaptation controller 134 may, in the embodiments presented herein, be operatively coupled to the antenna elements of the speaker grill to excite the antenna elements and dynamically switch frequencies based on a target frequency or frequencies to be emitted by the antenna elements. In order to switch between frequencies to be emitted from the antenna element, the antenna adaptation controller 134 may include circuitry used to alter the current and voltage applied to the antenna element. The antenna adaptation controller 134 may alter the current and voltage in order to alter the ratio of impedance to capacitive reactance at the antenna element, thereby altering the frequencies emitted by the antenna element.

Information handling system 100 may also represent a networked server or other system from which some software applications are administered or which wireless communications such as across WLAN or WWAN may be conducted. In other aspects, networked servers or systems may operate the antenna adaptation controller 134 for use with a wireless interface adapter 120 on those devices similar to embodiments for WLAN or WWAN antenna optimization operation according to according to various embodiments.

The information handling system 100 may include a processor 102 such as a central processing unit (CPU), a graphics processing unit (GPU), or both. Moreover, the information handling system 100 can include a main memory 104 and a static memory 106 that can communicate with each other via a bus 108. As shown, the information handling system 100 may further include a video display unit 110, such as a liquid crystal display (LCD), an organic light emitting diode (OLED), a flat panel display, or a solid-state display. Display 110 may include a touch screen display module and touch screen controller (not shown) for receiving user inputs to the information handling system 100. Touch screen display module may detect touch or proximity to a display screen by detecting capacitance changes in the display screen. Additionally, the information handling system 100 may include an input device 112, such as a keyboard, and a cursor control device, such as a mouse or touchpad or similar peripheral input device. The information handling system may include a power source such as battery 114 or an A/C power source. The information handling system 100 can also include a disk drive unit 116, and a signal generation device 118, such as a speaker or remote control. The information handling system 100 can include a network interface device such as a wireless adapter 120. The information handling system 100 can also represent a server device whose resources can be shared by multiple client devices, or it can represent an individual client device, such as a desktop personal computer, a laptop computer, a tablet computer, a wearable computing device, or a mobile smart phone.

The information handling system 100 includes an audio system that includes a speaker placed behind the speaker grill such as signal generation device 118. The speaker may be any device the receives a signal from the processor 102 and produces audio as input to the user. This output may be any type of audio including music and notification sounds. The speaker may be operatively coupled with an amplifier and a speaker driver software may drive generation of audio signals. As described herein, the speaker may be co-located with the antenna elements and speaker grill in order to decrease the footprint of the speaker and antenna systems consumed within the information handling system 100.

The information handling system 100 can include sets of instructions 124 that can be executed to cause the computer system to perform any one or more desired applications. In many aspects, sets of instructions 124 may implement wireless communications via one or more antenna systems 132 available on information handling system 100. In embodiments presented herein, the sets of instructions 124 may implement wireless communications in a variety of wireless communication protocols including various 5G protocols discussed herein via one or more antenna systems 132 formed as part of a speaker grill formed within a C-cover of a laptop-type information handling system. Operation of WLAN and WWAN wireless communications may be enhanced or otherwise improved via WLAN or WWAN antenna operation adjustments via the methods or controller-based functions relating to the antenna adaptation controller 134 disclosed herein. For example, instructions or a controller may execute software or firmware applications or algorithms which utilize one or more wireless links for wireless communications via the wireless interface adapter as well as other aspects or components. The antenna adaptation controller 134 may execute instructions as disclosed herein for monitoring wireless link state information, information handling system configuration data, SAR proximity sensor detection, or other input data to generate channel estimation and determine antenna radiation patterns. In the embodiments presented herein, the antenna adaptation controller 134 may execute instructions as disclosed herein to transmit a communications signal from a millimeter wave antenna element and an antenna system formed as part of a speaker grill that is excited to resonant a target frequency at a slot formed around a portion of the speaker grill. Both antenna elements may transmit an electromagnetic wave at the target frequency or harmonics thereof. The term "antenna system" described herein is meant to be understood as any object that emits or receives a radio frequency (RF) electromagnetic (EM) wave therefrom. According to some embodiments described herein, an "antenna system" includes one or both of a millimeter wave antenna element and a sub-6 GHz antenna element.

Additionally, the antenna adaptation controller 134 may prevent noise sourced beyond the speaker grill from creating interference with the determined frequency, or harmonics thereof via tuning of one or more antenna elements. In some embodiments presented herein, the antenna adaptation controller 134 may also execute instructions as disclosed herein to adjust, via tuning of a patch antenna element array or a parasitic coupling element for example, the directionality and/or pattern of the emitted RF signals from the antenna.

The antenna adaptation controller 134 may implement adjustments to wireless antenna systems and resources via a radio frequency integrated circuit (RFIC) front end 125 and WLAN or WWAN radio module systems within the wireless interface device 120. Aspects of the antenna optimization for the antenna adaptation controller 134 may be included as part of an antenna front end 125 in some aspects or may be included with other aspects of the wireless interface device 120 such as WWAN or WLAN radio module such as part of the radio frequency (RF) subsystems 130. The antenna adaptation controller 134 described in the present disclosure and operating as firmware or hardware (or in some parts software) may remedy or adjust one or more of a plurality of antenna systems 132 via selecting power adjustments and adjustments to an antenna adaptation network, such as an array of patch antennas, to modify antenna radiation patterns emitted through or by the speaker grill.

Multiple WLAN or WWAN antenna systems that include the speaker grill may operate on various communication frequency bands such as under IEEE 802.11a and IEEE 802.11g (i.e., medium frequency (MF) band, high frequency (HF) band, very high frequency (VHF) band, ultra-high frequency (VHF) band, L band, S band, C band, X band, $K_u$ band, K band, $K_a$ band, V band, W band, and millimeter wave bands) providing multiple band options for frequency channels. For embodiments herein, 5G frequency bands such as FR1 and FR2 may be transceived at the speaker grill antenna or antennas. Further antenna radiation patterns and selection of antenna options or power levels may be adapted due physical proximity of other antenna systems, of a user with potential SAR exposure, or improvement of RF channel operation according to received signal strength indicator (RSSI), signal to noise ratio (SNR), bit error rate (BER), modulation and coding scheme index values (MCS), or data throughput indications among other factors. In some aspects, the antenna adaptation controller may execute firmware algorithms or hardware to regulate operation of the one or more antenna systems 132 such as 5G antennas in the information handling system 100 to avoid poor wireless link performance due to poor reception, poor MCS levels of data bandwidth available, or poor indication of throughput due to indications of low RSSI, low power levels available (such as due to SAR), inefficient radiation patterns among other potential effects on wireless link channels used.

Various software modules comprising software application instructions 124 or firmware instructions may be coordinated by an operating system (OS) and via an application programming interface (API). An example operating system may include Windows®, Android®, and other OS types known in the art. Example APIs may include Win 32®, Core Java® API, Android® APIs, or wireless adapter driver API. In a further example, processor 102 may conduct processing of mobile information handling system applications by the information handling system 100 according to the systems and methods disclosed herein which may utilize wireless communications. The computer system 100 may operate as a standalone device or may be connected such as using a network, to other computer systems or peripheral devices. In other aspects, additional processor or control logic may be implemented in graphical processor units (GPUs) or controllers located with radio modules or within a wireless adapter 120 to implement method embodiments of the antenna adaptation controller and antenna optimization according to embodiments herein. Code instructions 124 in firmware, hardware or some combination may be executed to implement operations of the antenna adaptation controller and antenna optimization on control logic or processor systems within the wireless adapter 120 for example.

In a networked deployment, the information handling system 100 may operate in the capacity of a server or as a client user computer in a server-client user network environment, or as a peer computer system in a peer-to-peer (or distributed) network environment. The information handling system 100 can also be implemented as or incorporated into various devices, such as a personal computer (PC), a tablet PC, a set-top box (STB), a PDA, a mobile information handling system, a tablet computer, a laptop computer, a desktop computer, a communications device, a wireless smart phone, wearable computing devices, a control system, a camera, a scanner, a printer, a personal trusted device, a web appliance, a network router, switch or bridge, or any other machine capable of executing a set of instructions (sequential or otherwise) that specify actions to be taken by that machine. In a particular embodiment, the computer system 100 can be implemented using electronic devices that provide voice, video or data communication. Further, while a single information handling system 100 is illustrated, the term "system" shall also be taken to include any collection of systems or sub-systems that individually or jointly execute a set, or multiple sets, of instructions to perform one or more computer functions.

The disk drive unit 116 may include a computer-readable medium 122 in which one or more sets of instructions 124 such as software can be embedded. Similarly, main memory 104 and static memory 106 may also contain computer-readable medium for storage of one or more sets of instructions, parameters, or profiles 124. The disk drive unit 116 and static memory 106 also contains space for data storage.

Some memory or storage may reside in the wireless adapter 120. Further, the instructions 124 that embody one or more of the methods or logic as described herein. For example, instructions relating to the antenna adaptation system or antenna adjustments described in embodiments herein may be stored here or transmitted to local memory located with the antenna adaptation controller 134, antenna front end 125, or wireless module in RF subsystem 130 in the wireless interface adapter 120.

In a particular embodiment, the instructions, parameters, and profiles 124 may reside completely, or at least partially, within a memory, such as non-volatile static memory, during execution of antenna adaptation by the antenna adaptation controller 134 in wireless interface adapter 132 of information handling system 100. As explained, some or all of the antenna adaptation and antenna optimization may be executed locally at the antenna adaptation controller 134, RF front end 125, or wireless module subsystem 130. Some aspects may operate remotely among those portions of the wireless interface adapter or with the main memory 104 and the processor 102 in parts including the computer-readable media in some embodiments.

Battery 114 may be operatively coupled to a power management unit that tracks and provides power stat data 126. This power state data 126 may be stored with the instructions, parameters, and profiles 124 to be used with the systems and methods disclosed herein in determining antenna adaptation and antenna optimization in some embodiments.

The network interface device shown as wireless adapter 120 can provide connectivity to a network 128, e.g., a wide area network (WAN), a local area network (LAN), wireless local area network (WLAN), a wireless personal area network (WPAN), a wireless wide area network (WWAN), or other network. Connectivity may be via wired or wireless connection. Wireless adapter 120 may include one or more RF subsystems 130 with transmitter/receiver circuitry, modem circuitry, one or more unified antenna front end circuits 125, one or more wireless controller circuits such as antenna adaptation controller 134, amplifiers, antenna systems 132 and other radio frequency (RF) subsystem circuitry 130 for wireless communications via multiple radio access technologies. Each RF subsystem 130 may communicate with one or more wireless technology protocols. The RF subsystem 130 may contain individual subscriber identity module (SIM) profiles for each technology service provider and their available protocols for subscriber-based radio access technologies such as cellular LTE communications in both macrocellular and microcellular formats. The wireless adapter 120 may also include antenna systems 132 which may be tunable antenna systems or may include an antenna adaptation network for use with the system and methods disclosed herein to optimize antenna system operation. Additional antenna system adaptation network circuitry (not shown) may also be included with the wireless interface adapter 120 to implement modification measures as described in various embodiments of the present disclosure.

In some aspects of the present disclosure, a wireless adapter 120 may operate two or more wireless links. In a further aspect, the wireless adapter 120 may operate the two or more wireless links with a single, shared communication frequency band such as with the Wi-Fi WLAN operation or 5G LTE standard WWAN operations in an example aspect. For example, a 5 GHz wireless communication frequency band may be apportioned under the 5G standards for communication on either small cell WWAN wireless link operation or Wi-Fi WLAN operation as well as other wireless activity in LTE, WiFi, WiGig, Bluetooth, or other communication protocols. In some embodiments, the shared, wireless communication bands may be transmitted through one or a plurality of antennas. In an embodiment, the shared, wireless communication bands may be transmitted through one or a plurality of antennas each co-located with a plurality of speaker grills as described herein. Other communication frequency bands are contemplated for use with the embodiments of the present disclosure as well.

In other aspects, the information handling system 100 operating as a mobile information handling system may operate a plurality of wireless adapters 120 for concurrent radio operation in one or more wireless communication bands. The plurality of wireless adapters 120 may further operate in nearby wireless communication bands in some disclosed embodiments. Further, harmonics, environmental wireless conditions, and other effects may impact wireless link operation when a plurality of wireless links are operating as in some of the presently described embodiments. The series of potential effects on wireless link operation may cause an assessment of the wireless adapters 120 to potentially make antenna system adjustments according to the antenna adaptation control system of the present disclosure.

The wireless adapter 120 may operate in accordance with any wireless data communication standards. To communicate with a wireless local area network, standards including IEEE 802.11 WLAN standards, IEEE 802.15 WPAN standards, WWAN such as 3GPP or 3GPP2, or similar wireless standards may be used. In some embodiments, the antenna systems may operate as 5G networks that implement relatively higher data transfer wavelengths within a frequency range 1 (RF 1) between 450 and 7,125 MHz and frequency range 2 (FR2) between 24,250 and 52,600 MHz. In some embodiments, the antenna systems may operate as 5G networks that implement relatively higher data transfer wavelengths such as high frequency (HF) band, very high frequency (VHF) band, ultra-high frequency (VHF) band, L band, S band, C band, X band, Ku band, K band, Ka band, V band, W band, and millimeter wave bands.

Wireless adapter 120 and antenna adaptation controller 134 may connect to any combination of macro-cellular wireless connections including 2G, 2.5G, 3G, 4G, 5G or the like from one or more service providers. Utilization of RF communication bands according to several example embodiments of the present disclosure may include bands used with the WLAN standards and WWAN carriers which may operate in both licensed and unlicensed spectrums. For example, both WLAN and WWAN may use the Unlicensed National Information Infrastructure (U-NII) band which typically operates in the ~5 MHz frequency band such as 802.11 a/h/j/n/ac (e.g., center frequencies between 5.170-5.785 GHz). It is understood that any number of available channels may be available under the 5 GHz shared communication frequency band in example embodiments. WLAN, for example, may also operate at a 2.4 GHz band. WWAN may operate in a number of bands, some of which are propriety but may include a wireless communication frequency band at approximately 2.5 GHz band for example. In additional examples, WWAN carrier licensed bands may operate at frequency bands of approximately 700 MHz, 800 MHz, 1900 MHz, or 1700/2100 MHz for example as well. In the example embodiment, mobile information handling system 100 includes both unlicensed wireless RF communication capabilities as well as licensed wireless RF communication capabilities. For example, licensed wireless RF communication capabilities may be available via a subscriber carrier wireless service. With the licensed wireless RF communication capability, WWAN RF front end may operate on a licensed WWAN wireless radio with authorization for subscriber access to a wireless service provider on a carrier licensed frequency band.

The wireless adapter 120 can represent an add-in card, wireless network interface module that is integrated with a main board of the information handling system or integrated with another wireless network interface capability, or any combination thereof. In an embodiment the wireless adapter 120 may include one or more RF subsystems 130 including transmitters and wireless controllers such as wireless module subsystems for connecting via a multitude of wireless links under a variety of protocols. In an example embodiment, an information handling system may have an antenna system transmitter 132 for 5G small cell WWAN, Wi-Fi WLAN or WiGig connectivity and one or more additional antenna system transmitters 132 for macro-cellular communication. For example, in embodiments herein, one or more wireless adapters may control transceiving wireless signals in either millimeter-wave frequency bands such as 5G FR2, in sub-6 GHz frequency bands such as 5G FR1, or both. The RF subsystems 130 include wireless controllers to manage authentication, connectivity, communications, power levels for transmission, buffering, error correction, baseband processing, and other functions of the wireless adapter 120.

The RF subsystems 130 of the wireless adapters may also measure various metrics relating to wireless communication pursuant to operation of an antenna system as in the present disclosure. For example, the wireless controller of a RF subsystem 130 may manage detecting and measuring received signal strength levels, bit error rates, signal to noise ratios, latencies, power delay profile, delay spread, and other metrics relating to signal quality and strength. Such detected and measured aspects of wireless links operating on one or more antenna systems 132, may be used by the antenna adaptation controller to adapt the antenna systems 132 according to an antenna adaptation network according to various embodiments herein. In one embodiment, a wireless controller of a wireless interface adapter 120 may manage one or more RF subsystems 130. The wireless controller also manages transmission power levels which directly affect RF subsystem power consumption as well as transmission power levels from the plurality of antenna systems 132. The transmission power levels from the antenna systems 132 may be relevant to specific absorption rate (SAR) safety limitations for transmitting mobile information handling systems. To control and measure power consumption via a RF subsystem 130, the RF subsystem 130 may control and measure current and voltage power that is directed to operate one or more antenna systems 132.

The wireless network may have a wireless mesh architecture in accordance with mesh networks described by the wireless data communications standards or similar standards in some embodiments but not necessarily in all embodiments. The wireless adapter 120 may also connect to the external network via a WPAN, WLAN, WWAN or similar wireless switched Ethernet connection. The wireless data communication standards set forth protocols for communications and routing via access points, as well as protocols for a variety of other operations. Other operations may include handoff of client devices moving between nodes, self-organizing of routing operations, or self-healing architectures in case of interruption.

In some embodiments, software, firmware, dedicated hardware implementations such as application specific integrated circuits, programmable logic arrays and other hardware devices can be constructed to implement one or more of the methods described herein. Applications that may include the apparatus and systems of various embodiments can broadly include a variety of electronic and computer systems. One or more embodiments described herein may implement functions using two or more specific interconnected hardware modules or devices with related control and data signals that can be communicated between and through the modules, or as portions of an application-specific integrated circuit. Accordingly, the present system encompasses software, firmware, and hardware implementations.

In accordance with various embodiments of the present disclosure, the methods described herein may be implemented by firmware or software programs executable by a controller or a processor system. Further, in an exemplary, non-limited embodiment, implementations can include distributed processing, component/object distributed processing, and parallel processing. Alternatively, virtual computer system processing can be constructed to implement one or more of the methods or functionalities as described herein.

The present disclosure contemplates a computer-readable medium that includes instructions, parameters, and profiles 124 or receives and executes instructions, parameters, and profiles 124 responsive to a propagated signal; so that a device connected to a network 128 can communicate voice, video or data over the network 128. Further, the instructions 124 may be transmitted or received over the network 128 via the network interface device or wireless adapter 120.

Information handling system 100 includes one or more application programs 124, and Basic Input/Output System and firmware (BIOS/FW) code 124. BIOS/FW code 124 functions to initialize information handling system 100 on power up, to launch an operating system, and to manage input and output interactions between the operating system and the other elements of information handling system 100. In a particular embodiment, BIOS/FW code 124 reside in memory 104, and include machine-executable code that is executed by processor 102 to perform various functions of information handling system 100. In another embodiment (not illustrated), application programs and BIOS/FW code reside in another storage medium of information handling system 100. For example, application programs and BIOS/FW code can reside in drive 116, in a ROM (not illustrated) associated with information handling system 100, in an option-ROM (not illustrated) associated with various devices of information handling system 100, in storage system 107, in a storage system (not illustrated) associated with network channel of a wireless adapter 120, in another storage medium of information handling system 100, or a combination thereof. Application programs 124 and BIOS/FW code 124 can each be implemented as single programs, or as separate programs carrying out the various features as described herein.

While the computer-readable medium is shown to be a single medium, the term "computer-readable medium" includes a single medium or multiple media, such as a centralized or distributed database, and/or associated caches and servers that store one or more sets of instructions. The term "computer-readable medium" shall also include any medium that is capable of storing, encoding, or carrying a set of instructions for execution by a processor or that cause a computer system to perform any one or more of the methods or operations disclosed herein.

In a particular non-limiting, exemplary embodiment, the computer-readable medium can include a solid-state memory such as a memory card or other package that houses one or more non-volatile read-only memories. Further, the computer-readable medium can be a random-access memory or other volatile re-writable memory. Additionally, the computer-readable medium can include a magneto-optical or optical medium, such as a disk or tapes or other storage device to store information received via carrier wave signals such as a signal communicated over a transmission medium. Furthermore, a computer readable medium can store information received from distributed network resources such as from a cloud-based environment. A digital file attachment to an e-mail or other self-contained information archive or set of archives may be considered a distribution medium that is equivalent to a tangible storage medium. Accordingly, the disclosure is considered to include any one or more of a computer-readable medium or a distribution medium and other equivalents and successor media, in which data or instructions may be stored.

Figure 2:
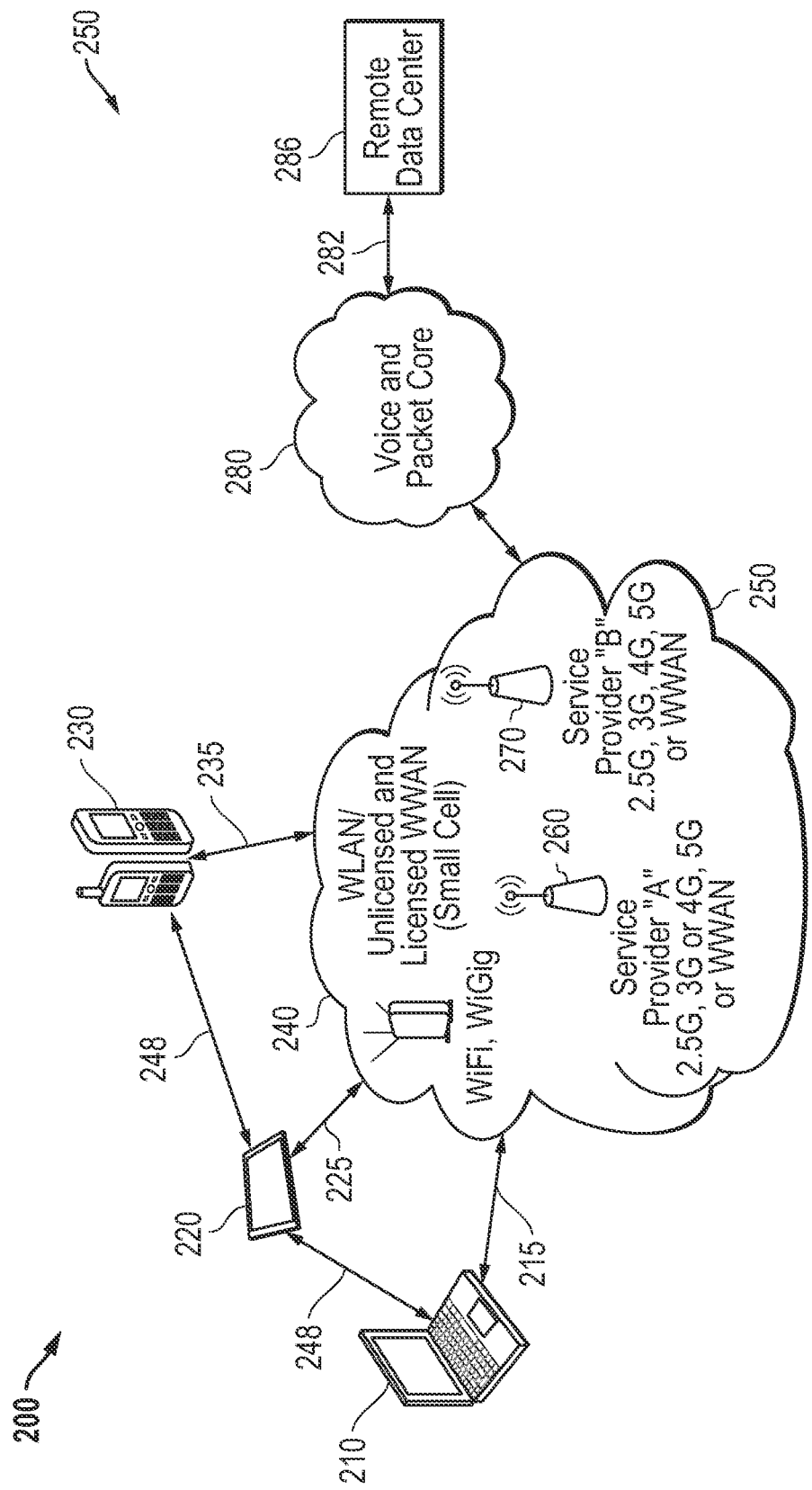
FIG. 2 is a block diagram of a network environment offering several communication protocol options and mobile information handling systems according to an embodiment of the present disclosure.

FIG. 2 illustrates a network 200 that can include one or more information handling systems 210, 220, 230. In a particular embodiment, network 200 includes networked mobile information handling systems 210, 220, and 230, wireless network access points, and multiple wireless connection link options. A variety of additional computing resources of network 200 may include client mobile information handling systems, data processing servers, network storage devices, local and wide area networks, or other resources as needed or desired. As partially depicted, systems 210, 220, and 230 may be a laptop computer, tablet computer, 360-degree convertible systems, wearable computing devices, or a smart phone device. These mobile information handling systems 210, 220, and 230, may access a wireless local network 240, or they may access a macro-cellular network 250. For example, the wireless local network 240 may be the wireless local area network (WLAN), a wireless personal area network (WPAN), or a wireless wide area network (WWAN). In an example embodiment, LTE-LAA WWAN may operate with a small-cell WWAN wireless access point option.

Since WPAN or Wi-Fi Direct Connection 248 and WWAN networks can functionally operate similar to WLANs, they may be considered as wireless local area networks (WLANs) for purposes herein. Components of a WLAN may be connected by wireline or Ethernet connections to a wider external network. For example, wireless network access points may be connected to a wireless network controller and an Ethernet switch. Wireless communications across wireless local network 240 may be via standard protocols such as IEEE 802.11 Wi-Fi, IEEE 802.11ad WiGig, IEEE 802.15 WPAN, IEEE 802.11, IEEE 1914/1904, IEEE P2413/1471/42010, or emerging 5G small cell WWAN communications such as eNodeB, or similar wireless network protocols. Alternatively, other available wireless links within network 200 may include macro-cellular connections 250 via one or more service providers 260 and 270. Service provider macro-cellular connections may include 2G standards such as GSM, 2.5G standards such as GSM EDGE and GPRS, 3G standards such as W-CDMA/UMTS and CDMA 2000, 4G standards, or emerging 5G standards including WiMAX, LTE, and LTE Advanced, LTE-LAA, small cell WWAN, and the like.

Wireless local network 240 and macro-cellular network 250 may include a variety of licensed, unlicensed or shared communication frequency bands as well as a variety of wireless protocol technologies ranging from those operating in macrocells, small cells, picocells, or femtocells.

In some embodiments according to the present disclosure, a networked mobile information handling system 210, 220, or 230 may have a plurality of wireless network interface systems capable of transmitting simultaneously within a shared communication frequency band. That communication within a shared communication frequency band may be sourced from different protocols on parallel wireless network interface systems or from a single wireless network interface system capable of transmitting and receiving from multiple protocols. Similarly, a single antenna or plural antennas may be used on each of the wireless communication devices. In some embodiments, the antenna systems may operate as 5G networks that implement relatively higher data transfer wavelengths within a frequency range 1 (RF 1) between 450 and 7,125 MHz and frequency range 2 (FR2) between 24,250 and 52,600 MHz. In some embodiments, the antenna systems may operate as 5G networks that implement relatively higher data transfer wavelengths such as high frequency (HF) band, very high frequency (VHF) band, ultra-high frequency (VHF) band, L band, S band, C band, X band, Ku band, K band, Ka band, V band, W band, and millimeter wave bands. Example competing protocols may be local wireless network access protocols such as Wi-Fi/WLAN, WiGig, and small cell WWAN in an unlicensed, shared communication frequency band. Example communication frequency bands may include unlicensed 5 GHz frequency bands or 3.5 GHz conditional shared communication frequency bands under FCC Part 96. Wi-Fi ISM frequency bands that may be subject to sharing include 2.4 GHz, 60 GHz, 900 MHz or similar bands as understood by those of skill in the art. Within local portion of wireless network 250 access points for Wi-Fi or WiGig as well as small cell WWAN connectivity may be available in 5G technology. This may create situations where a plurality of antenna systems are operating on a mobile information handling system 210, 220 or 230 via concurrent communication wireless links on both WLAN and WWAN and which may operate within the same, adjacent, or otherwise interfering communication frequency bands. The antenna may be a transmitting antenna that includes high-band, medium-band, low-band, and unlicensed band transmitting antennas. Alternatively, embodiments may include a single transceiving antennas capable of receiving and transmitting, and/or more than one transceiving antennas. Each of the antennas included in the information handling system 100 in an embodiment may be subject to the FCC regulations on specific absorption rate (SAR).

The voice and packet core network 280 may contain externally accessible computing resources and connect to a remote data center 286. The voice and packet core network 280 may contain multiple intermediate web servers or other locations with accessible data (not shown). The voice and packet core network 280 may also connect to other wireless networks similar to 240 or 250 and additional mobile information handling systems such as 210, 220, 230 or similar connected to those additional wireless networks. Connection 282 between the wireless network 240 and remote data center 286 or connection to other additional wireless networks may be via Ethernet or another similar connection to the world-wide-web, a WAN, a LAN, another WLAN, or other network structure. Such a connection 282 may be made via a WLAN access point/Ethernet switch to the external network and be a backhaul connection. The access point may be connected to one or more wireless access points in the WLAN before connecting directly to a mobile information handling system or may connect directly to one or more mobile information handling systems 210, 220, and 230. Alternatively, mobile information handling systems 210, 220, and 230 may connect to the external network via base station locations at service providers such as 260 and 270. These service provider locations may be network connected via backhaul connectivity through the voice and packet core network 280.

Remote data centers may include web servers or resources within a cloud environment that operate via the voice and packet core 280 or other wider internet connectivity. For example, remote data centers can include additional information handling systems, data processing servers, network storage devices, local and wide area networks, or other resources as needed or desired. Having such remote capabilities may permit fewer resources to be maintained at the mobile information handling systems 210, 220, and 230 allowing streamlining and efficiency within those devices. Similarly, remote data center permits fewer resources to be maintained in other parts of network 200.

Although 215, 225, and 235 are shown connecting wireless adapters of mobile information handling systems 210, 220, and 230 to wireless networks 240 or 250, a variety of wireless links are contemplated. Wireless communication may link through a wireless access point (Wi-Fi or WiGig), through unlicensed WWAN small cell base stations such as in network 240 or through a service provider tower such as that shown with service provider A 260 or service provider B 270 and in network 250. In other aspects, mobile information handling systems 210, 220, and 230 may communicate intra-device via 248 when one or more of the mobile information handling systems 210, 220, and 230 are set to act as an access point or even potentially an WWAN connection via small cell communication on licensed or unlicensed WWAN connections. For example, one of mobile information handling systems 210, 220, and 230 may serve as a Wi-Fi hotspot in an embodiment. Concurrent wireless links to information handling systems 210, 220, and 230 may be connected via any access points including other mobile information handling systems as illustrated in FIG. 2.

Figure 3A:
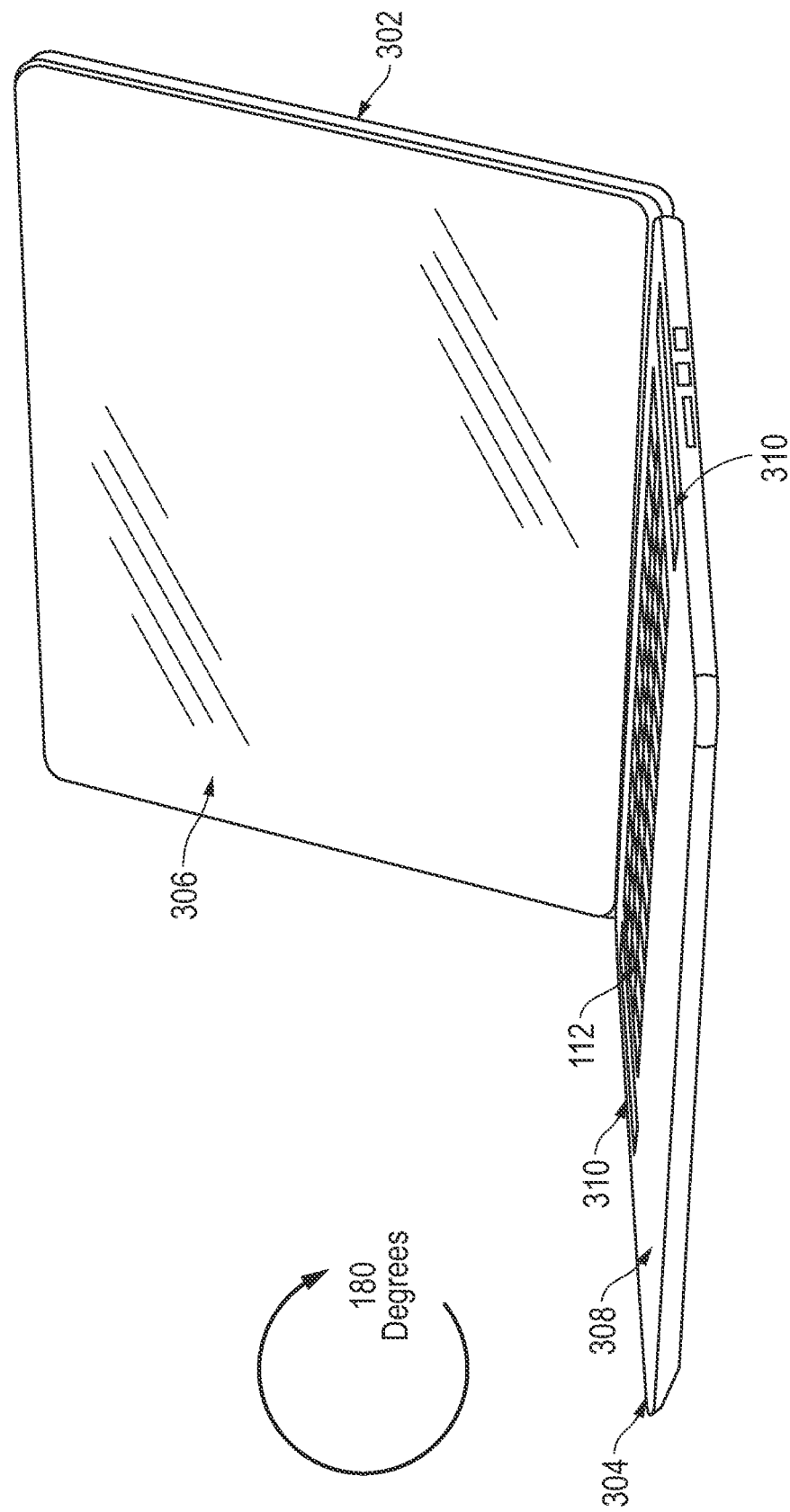
FIG. 3A is a graphical illustration of an information handling system placed in an open configuration including a speaker grill according to an embodiment of the present disclosure.

FIG. 3A is a graphical illustration of a metal chassis including a base chassis and display chassis placed in an open configuration according to an embodiment of the present disclosure. The open configuration is shown for illustration purposes. It is understood that a closed configuration would have the lid chassis fully closed onto the base chassis. The metal chassis 300 in an embodiment may comprise an outer metal case or shell of an information handling system such as a tablet device, laptop, or other mobile information handling system. As shown in FIG. 3A, the metal chassis 300, in an embodiment, may further include a plurality of chassis or cases. For example, the metal chassis 300 may further include an A-cover 302 and a B-cover 306 functioning to enclose a portion of the information handling system serving as a display chassis. As another example, the metal chassis 300, in an embodiment, may further include a D-cover 304 functioning to enclose another portion of the information handling system along with a C-cover 308 serving as a base chassis which may include a transmitting/receiving antenna according to the embodiments described herein. The C-cover 308 may include, for example, a keyboard, a trackpad, or other input/output (I/O) device. When placed in the closed configuration, the A-cover 302 forms a top outer protective shell, or a portion of a lid for the information handling system, while the D-cover 304 forms a bottom outer protective shell, or a portion of a base. When in the fully closed configuration, the A-cover 302 and the D-cover 304 would be substantially parallel to one another.

In some embodiments, both the A-cover 302 and the D-cover 304 may be comprised of metal. In some embodiments, the A-cover 302 and D-cover 304 may include both metallic and plastic components. For example, plastic components that are radio-frequency (RF) transparent may be used to form a portion of the C-cover 308 where a speaker grill 310 in the C-cover 308 has a covered slot around a portion of the speaker grill 310. According to the embodiments of the present disclosure, the speaker grill 310 may be formed as a part of the C-cover. In these examples, the speaker grill 310 may be formed within the C-cover 308 by forming a speaker grill 310 within a side portion of the C-cover 308 adjacent to a keyboard in some embodiments as shown in FIG. 3A. In the embodiments described herein, a portion of the speaker grill 310 may be physically separated from the C-cover 308 by forming a slot around a portion of the speaker grill 310 and through the C-cover 308. As is described herein, the length of the slot around the portion of the speaker grill 310 may be dependent on a target frequency or frequencies to be emitted upon excitation of the speaker grill 310 by a tuning module. Additionally, in the present specification and in the appended claims, the term "portion" is meant to be understood as a part of a whole. Therefore, in the embodiments disclosed herein, the slot formed around the speaker grill 310 may be less than a total cut-out of the speaker grill 310 from the C-cover 308.

The speaker grill 310 may, therefore, be an integral part of the C-cover 308. In these examples, the speaker grill 310 may also be used to cover or protect both a speaker and an antenna placed below the C-cover 308 and speaker grill 310 in order to provide audio output to a user of the information handling system. The placement of an antenna behind the speaker grill 310 or slot allows an additional location for antennas or for the removal of the antenna system from the A-cover 302 and B-cover 306. Consequently, the space within the A-cover 302/B-cover 306 assembly where an antenna may have been placed may be eliminated allowing for a relatively larger video display device placed therein. As a result of placing the antenna element within the C-cover 308, behind, or as part of the speaker grill 310, the capabilities of information handling system may be increased with plural antenna systems while also utilizing base chassis space for both wireless and audio components.

In an embodiment, the speaker grill 310 may be formed at any location on the C-cover 308. Therefore, although FIG. 3A shows two speaker grills 310 located to the left and right of a keyboard 112, the present specification contemplates that the speaker grill 310 or speaker grills 310 may be formed along any surface of the C-cover 308. In the embodiments, each of the individual speaker grills 310 may have antenna systems that are excited to emit an RF EM wave signal at different frequencies allowing for the ability of the information handling system to communicate on a variety of radio access technologies (RATs).

In an embodiment, the A-cover 302 may be movably connected to a back edge of the D-cover 304 via one or more hinges. In this configuration shown in FIG. 3A the hinges allow the A-cover 302 to rotate from and to the D-cover 304 allowing for multiple orientations of the information handling system as described herein. In an embodiment, the information handling system may include a sensor to detect the orientation of the information handling system and activate or deactivate any of a number of antenna systems associated with the speaker grill 310 based on the occurrence of any specific orientation in some embodiments.

Figure 3B:
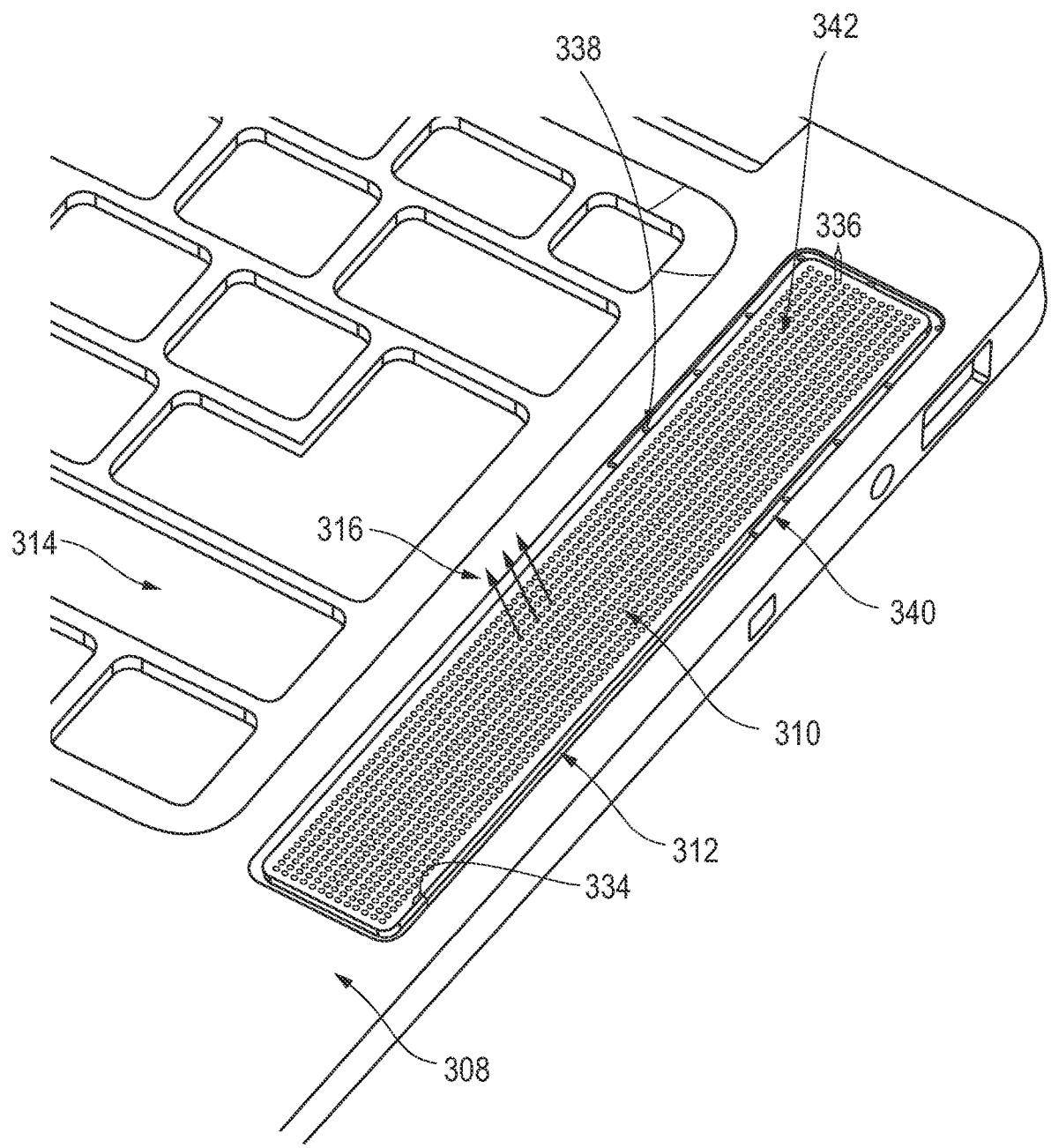
FIG. 3B is a perspective graphical illustration of a C-cover and speaker grill of an information handling system according to an embodiment of the present disclosure.

FIG. 3B is a perspective graphical illustration of a C-cover 308 and speaker grill 310 of an information handling system according to an embodiment of the present disclosure. FIG. 3B shows the C-cover 308 without an underlying D-cover 304 or the keyboard as described in connection with FIG. 3A. The D-cover 304 and keyboard have been removed for ease of illustration and the present specification contemplates that, during assembly, the D-cover 304 and keyboard along with other components of the information handling system are to be assembled together with the C-cover 308 and its speaker grill 310. A side wall of the information handling system may be formed from part of the C-cover 308, in one embodiment, or D-cover 304, in another embodiment, so that during assembly of the C-cover 308 and D-cover 304 the information handling system may be closed.

The C-cover 308 may include a number of vias 314 through which keys of a keyboard may be placed. Additionally, the C-cover 308 may include a speaker grill 310. The speaker grill 310, as described herein, may serve a plurality of functions. A first function may include a physical barrier between the user and a speaker positioned below the speaker grill 310 and C-cover 308. This speaker may receive input from a processor and provide output (i.e., music and notification sounds) to a user during operation of the information handling system. As a physical barrier, the speaker grill 310 may prevent a user from touching and damaging the speaker as well as other delicate elements placed below the C-cover 308.

In an embodiment, the speaker grill 310 may include a mesh of speaker grill openings that include a number of holes 342 through which sound waves from the speaker may pass. These holes 342 or other speaker grill openings may be sized and spaced out with a specific pitch such that millimeter wave RF EM transmissions may pass therethrough as indicated by perpendicular arrows 316 as well in embodiments herein. In the embodiments presented herein, the speaker grill 310 may house a millimeter wave antenna element underneath that emits RF EM waves in the millimeter wave ranges through the holes 342 in the speaker grill 310. Because of the relatively shorter wavelengths involved with millimeter waves, some holes within the speaker grill 310 may not impede the transmission of these waves depending on the size and spacing of the holes 342. As such, the holes 342 within the speaker grill 310 may define a mesh pattern that is transparent to these millimeter wave frequencies emitted by the millimeter wave antenna element. In specific embodiments, the pitch of the holes 342 within the mesh may be 1 mm by 1 mm so as to allow for the passage of the millimeter RF EM waves. In an embodiment, the mesh pattern of the speaker grill 310 comprises a pitch of holes 342 that are between 0.5 mm and 1.5 mm by 0.5 mm and 1.5 mm. In an example, the mesh pattern of speaker grill comprises a plurality of holes 342 defined in the speaker grill 310 wherein the holes 342 have a diameter between 0.2 mm and 0.8 mm. In any embodiment, the diameter 336 of each hole and the pitch of the holes 342 formed directly above the millimeter wave antenna element to accommodate for the transmission of millimeter RF EM waves through the speaker grill 310 are sized with to produce little or no interference.

A second function of the speaker grill 310 is to propagate RF EM waves emitted from a slot 334 formed around the speaker grill 310 using a slot antenna element capacitively coupled to the slot 334 of the speaker grill 310. In the embodiments described herein, the speaker grill 310 may have a slot formed around a portion of the circumference of the speaker grill 310. The slot may be cut between the speaker grill 310 and the C-cover 308 using any type of manufacturing process including laser ablation, electroforming, anisotropic etching, photolithography, or any other type of precision fabrication processing. As described herein, the slot may be formed along one edge of the speaker grill 310 or along multiple edges of the speaker grill 310 and may have a plastic trim ring 312 placed therein to protect those elements placed behind the speaker grill 310. In a specific embodiment, the slot may be formed around a first edge of the speaker grill 310, wrap around to a second edge of the speaker grill 310, and continue onto terminate along a third edge of the speaker grill 310. In this specific embodiment, the slot may make a U-shaped slot around the perimeter of the speaker grill 310. In these examples, the slot antenna element capacitively coupled to the slot 334 of the speaker grill 310 may cause the speaker grill 310 to radiate and emit therefrom 5G FR1 frequencies that include a sub-6 GHz RF EM waves. The slot antenna, in an embodiment, may interact with a length of the slot 334 as an aperture thereby causing the slot antenna to act as an aperture antenna that, additionally, implements resonance frequencies created by the slot antenna to increase the power of the RF EM waves produced by the slot antenna. In these embodiments, a single speaker grill 310 may have multiple antennas to engage in plural communications with multiple networks using multiple RF EM frequency bands.

In order to prevent physical access by objects or the user below the C-cover 308, the speaker grill 310 includes a plastic trim ring 312 placed within the formed slot. In an embodiment, the plastic trim ring 312 may be placed around a portion of the speaker grill 310. In an example, the plastic trim ring 312 may be placed along an entirety of the perimeter of the speaker grill 310. In either embodiment, the plastic trim ring 312 formed around the speaker grill 310 may be formed to lie flush with the speaker grill 310, the C-cover 308, or both. Placing the plastic trim ring 312 flush with the speaker grill 310, the C-cover 308, or both may render the information handling system aesthetically appealing while also preventing objects from passing through the C-cover 308 via the slot. Still further, because the plastic trim ring 312 is made of a RF transparent material (i.e., plastic), RF EM wave emissions from the antenna elements may still be allowed to propagate away from the speaker grill 310 and information handling system without being blocked by an RF non-transparent material. In any embodiment described herein, the color of the plastic trim ring 312 may be painted or chosen to match the color of the C-cover 308 so as to hide the existence of the plastic trim ring 312 thereby increasing the aesthetics of the information handling system.

Although FIG. 3B shows a single speaker grill 310 speaker grill 310 formed into the C-cover 308, the present specification contemplates that any number of speaker grills 310 may be formed into the C-cover 308. In this embodiment, the length and width of the slot formed along the perimeter of the speaker grill 310 may be distinguished from slots associated with other speaker grills 310 so as to alter the band of RF EM waves, such as sub-6 GHz frequency bands capable of being emitted from that specific speaker grill 310 during excitation of that sub-6 GHz antenna. Similarly, the size and pitch of the mesh holes 342 accommodates for multiple mm-wave antennas or antenna arrays for the various RF EM frequency bands. Consequently, the information handling system may include multiple speaker grills 310 capable of transmitting data at multiple RF bands consecutively or concurrently. This increases the communication capabilities of the information handling system such that, in some embodiments, the information handling system can communicate via LTE, Wi-Fi, WiGig, or other communication protocols based on the frequency band within 5G ranges emitted by the individual antenna elements with the speaker grills. Thus, according to the embodiments presented herein, the antenna systems being incorporated into the speaker grill 310 allows for flexibility in the type of antenna being installed at or formed at the speaker grill 310 thereby increasing the ability for designers to determine how the information handling system is to communicate with a wireless infrastructure by selecting RF EM frequency bands to be used for these communications. Additionally, placement of each of the speaker grills 310 or the speaker grill 310 shown in FIG. 3B may be anywhere on the surface of the C-cover 308 with the slot cut out around a portion of the perimeter of the speaker grill 310 on the C-cover 308. Also, by incorporating the antenna system described herein behind the speaker grill 310 allows for more compact and streamlined information handling system utilizing space for both wireless and audio components while adding to the aesthetics of the information handling system.

In an embodiment presented herein, the plastic trim ring 312 may be maintained within the slot formed around the speaker grill 310 via an undercut. The undercut may be formed so as to prevent the plastic trim ring 312 from being removed vertically from the slot formed. Because the slot is not formed completely around the speaker grill 310, a portion of the perimeter of the speaker grill 310 may have a trench formed around the perimeter that does not cut entirely through the C-cover 308 as the slot does. In this embodiment, the trench may also include an undercut that prevents the plastic trim ring 312 form being removed vertically (i.e., perpendicular to the surface of the C-cover 308) from the C-cover 308 thereby exposing the trench and slot as described herein. Any other retention device may be incorporated into the slot or trench in order to prevent the removal of the plastic trim ring and the exposure of the slot.

Figure 3C:
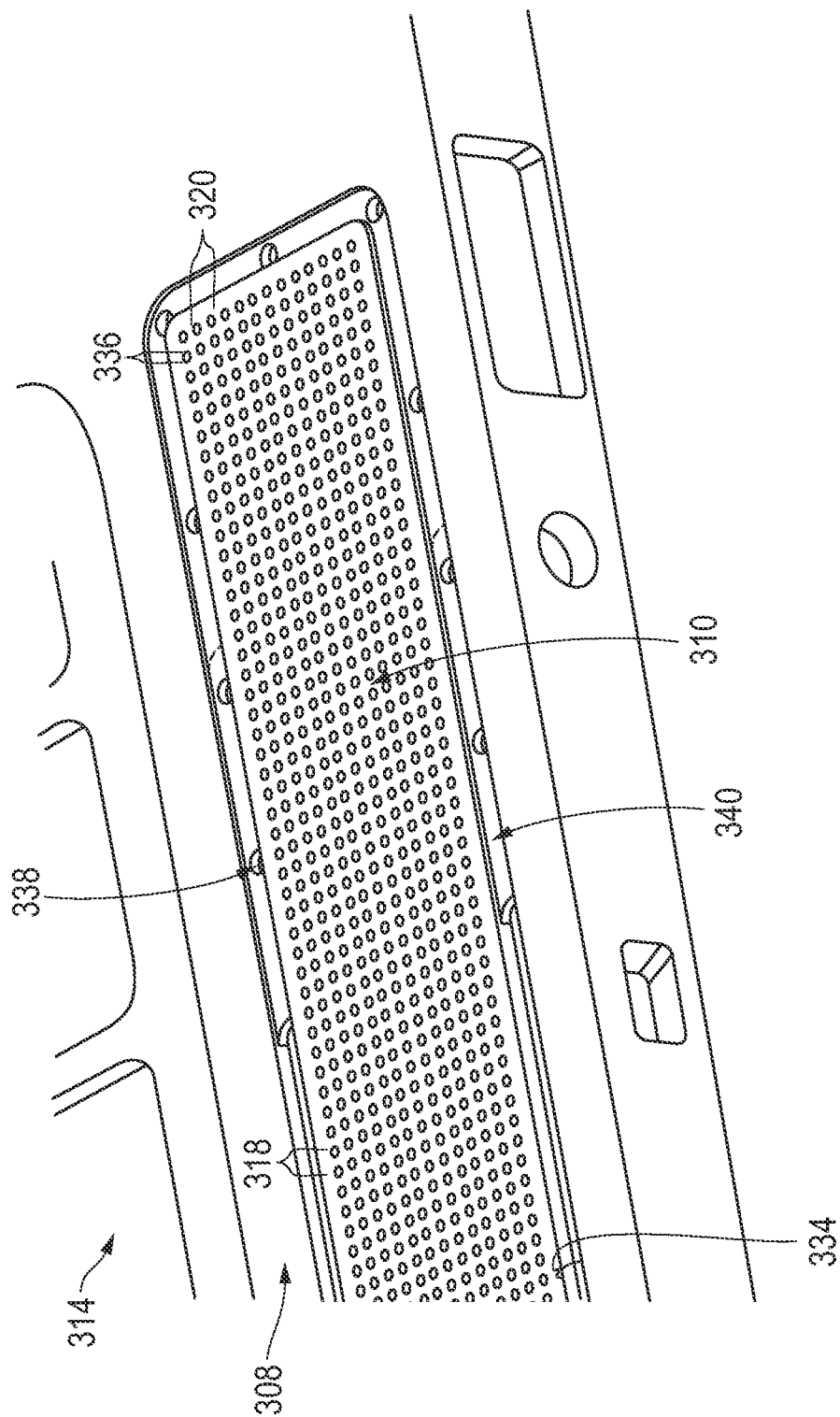
FIG. 3C is another graphical illustration of the C-cover and speaker grill of an information handling system according to an embodiment of the present disclosure.

FIG. 3C is another graphical illustration of the C-cover 308 and speaker grill 310 of an information handling system shown in FIG. 3B according to an embodiment of the present disclosure. As described in connection with FIG. 3B, the speaker grill 310 may have a plurality of holes 342 defined therein. These holes 342 may serve two purposes. A first purpose may be to allow audio waves to pass from a speaker placed behind the speaker grill 310, through the speaker grill 310, and to a user. As described herein, the speaker may emit any noise or sound that allows the user to receive output from the speaker.

A second purpose of the holes 342 is to allow for the transmission of millimeter waves from a millimeter wave antenna element placed behind a speaker grill 310. The holes 342 may be specifically spaced apart (i.e., have a specific pitch) so that the millimeter waves emitted by the millimeter wave antenna element can pass through. In an embodiment, a horizontal spacing 318 between each of the holes 342 may be 1 mm. In an embodiment, a vertical spacing 320 between each of the holes 342 may be 1 mm. In various embodiments, for transparency to millimeter-wave transmissions, it has been determined that the horizontal spacing 318 between each of the holes 342 may be between 0.5 mm and 1.5 mm. In further embodiments, the vertical spacing 320 between each of the holes 342 may be between 0.5 mm and 1.5 mm.

In an embodiment, the diameter 336 of the holes 342 may also be selected to allow for the passage of the millimeter waves emitted by the millimeter wave antenna element. In an embodiment, the diameter 336 of the holes may be between 0.2 and 0.8 mm. In an embodiment, the diameter 336 of the holes 342 may be greater than 0.8 mm. In an embodiment, the diameter 336 of the holes may be 0.5 mm. In an embodiment, the vertical spacing 320, horizontal spacing 318, and diameter 336 of the holes 342 may vary across the length or width of the speaker grill 310 based on the position of objects placed behind the speaker grill 310. For example, the holes 342 defined in the speaker grill 310 above where a speaker is placed may be smaller or larger than the holes 342 defined in the speaker grill 310 above the millimeter wave antenna element. In some embodiments, the diameters 336 of the holes 342 defined in the speaker grill 310 above where the speaker is placed may be smaller or larger than the holes 342 defined in the speaker grill 310 above where the millimeter wave antenna element is placed. This differentiation in pitch (i.e., horizontal spacing 318 and vertical spacing 320) and diameter 336 of the holes 342 across the surface of the speaker grill 310 may allow for better transmission of the millimeter RF EM waves from the millimeter wave antenna element as well as the better transmission of the audio waves by the speaker thereby increasing the operability of the information handling system. In an embodiment, the vertical spacing 320, horizontal spacing 318, and diameter 336 of the holes 342 may be different between a plurality of speaker grills 310 formed in the C-cover 308. With a plurality of speaker grills 310 formed into the C-cover 308, a plurality of different millimeter-wave antennas may be used in the information handling system with the ability of a first millimeter-wave antenna to emit a low millimeter-wave frequency and a second millimeter-wave antenna to emit a relatively higher millimeter-wave frequency. In an embodiment where an information handling system has a plurality of speaker grills 310, the size and pitch of the holes 342 or other speaker grill openings may be selected based upon the largest diameter required to accommodate any deployed mm-wave antennas under either speaker grill 310 to maintain uniformity of hole 342 appearance. The larger sized holes may accommodate a plurality of mm-wave frequency bands allowing those frequencies to pass through the speaker grills 310 in such embodiments.

FIG. 3B also shows the speaker grill 310 with the trim ring 312 formed partially through a trench 340 in order to show the slot 334 formed around a portion of the speaker grill 310. In this embodiment, the trim ring 312 may be placed within the entire lengths of the slot 334 and trench 340. The trench 340 may include at least one interlocking hole 338. The interlocking hole 338 may be used to secure the trim ring 312 within the trench 340 when the trim ring 312 is coupled to the slot 334 and trench 340.

Similar to FIG. 3B, the C-cover 308 is depicted in FIG. 3C as including a plurality of vias 314. The vias 314 may each receive a key from a keyboard. Thus, although FIG. 3C does not show a keyboard operatively coupled to the C-cover 308, the present specification contemplates that, during assembly, a keyboard may be operatively coupled to the C-cover 308.

Although FIG. 3C shows a speaker grill 310 formed on a right side of the C-cover 308, the present specification contemplates that the speaker grill 310 or an additional speaker grills 310 may be formed on other edges or surfaces of the C-cover 308.

Figure 3D:
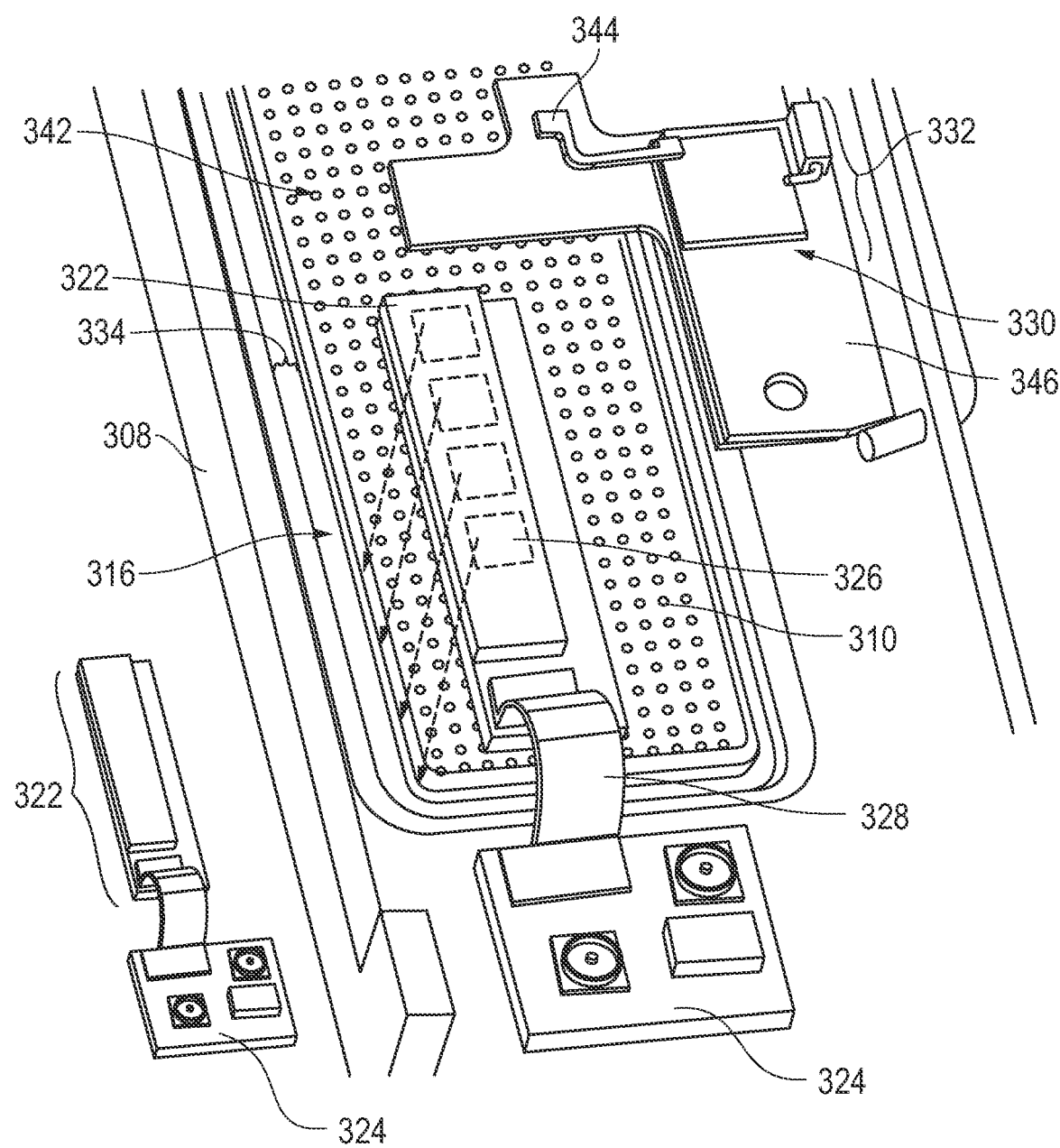
FIG. 3D is a graphical illustration of a bottom side of a speaker grill formed into a C-cover of an information handling system according to an embodiment of the present disclosure.

FIG. 3D is a graphical illustration of a bottom side of a speaker grill formed into a C-cover of an information handling system according to an embodiment of the present disclosure. The speaker grill 310 shown in the FIG. 3D may be similar to some aspects of the speaker grill 310 shown in FIG. 3C. The speaker grill 310 shown in FIG. 3D is a view specifically of a back side of the speaker grill 310 on the C-cover 308 showing a placement of a millimeter wave antenna 322 and a printed circuit board (PCB) 324 on a back side of the speaker grill 310 and C-cover 308, respectively. FIG. 3D also shows a millimeter-wave antenna 322 mounted on a circuit board with at least one millimeter wave antenna element 326 operatively coupled to a printed circuit board 324 via a flex cable 328 as well as operatively coupled to the speaker grill 310.

In the embodiment shown in FIG. 3D, a lower portion of the speaker grill 310 may be occupied by the millimeter wave antenna 322. As described herein, the millimeter wave antenna 322 may be operatively coupled to the back side of the speaker grill 310. In an example a glue, screws, or other fastening device or element may be used to secure the millimeter wave antenna 322 to the back side of the speaker grill 310.

As described herein, the speaker grill 310 may have a slot 334 formed around the speaker grill 310. The slot 334 shown in FIG. 3D may be filled with a plastic trim ring 312. In an embodiment, the plastic trim ring 312 may be formed into the slot 334 using a compression molding process. As described herein, the plastic trim ring may be retained in the slot 334 using an undercut or any other type of retention device formed within the slot 334.

The speaker grill 310 may include millimeter wave antenna 322 mechanically coupled to a back side of the speaker grill 310. The millimeter wave antenna 322 may be coupled to the back side of the speaker grill 310 using, for example, a fastener such as a screw a nail, a clip or a chemical fastener such as a glue. As depicted in FIG. 3D, the millimeter wave antenna 322 is operatively coupled to the back side of the speaker grill 310 at a location where, for example, a speaker is placed. In this example, the millimeter wave antenna 322 is placed at a lower portion of the speaker grill 310 thereby using space along the speaker grill 310 not used by the speaker to transmit audio signals.

The millimeter wave antenna 322 may be any type of antenna and may include a plurality of antenna elements 326. In FIG. 3D the millimeter wave antenna 322 comprises an array of patch antenna elements 326 whose location on the millimeter wave antenna 322 are shown by dotted squares. A patch antenna element 326, in the present embodiments, is a type of RF antenna with a low profile, mounted on a flat surface such as a circuit board, and consisting of a sheet or "patch" of metal mounted over a larger sheet of metal called a ground plane. In the embodiment shown in FIG. 3D, the millimeter wave antenna 322 includes 4 patch antennas 326 mounted facing speaker grill 310. The use of multiple patch antennas 326 (e.g., in an array of 1 by 4 patch antenna elements 326 in FIG. 3D) on the same substrate can be used to make high gain array antennas, and phased arrays in which the RF EM waves emitted therefrom are electronically steered. This may be used to allow the millimeter wave antenna 322 to direct the RF EM waves toward a specific access point remote from the information handling system. By doing so, the communication with the access point and any network attached thereto may be increased allowing for the millimeter wave antenna 322 to effectively transmit large amounts of data. The millimeter wave antenna 322 may steer the RF EM waves by, for example, controlling the phase and relative amplitude of the RF EM waves emitted by each of the patch antenna elements 326 in order to create a pattern of constructive and destructive interference among the entire wave front produced by the millimeter wave antenna 322.

The millimeter wave antenna 322 with the array of patch antenna elements 326 may be, in an embodiment, communicatively and electrically coupled to a first printed circuit board (PCB) 324 formed within a cavity formed behind the speaker grill 310. In an embodiment, the first PCB 324 may include an antenna front end module. The antenna front end may, in the embodiments presented herein, be operatively coupled to the millimeter wave antenna 322 in order to cause the millimeter wave antenna 322 to emit one or a plurality of frequencies based on the target frequency or a plurality of target frequencies or harmonics thereof. The antenna front end may also, in some embodiments, steer the RF EM waves emitted by the patch antenna elements 326 by, for example, controlling the phase and relative amplitude of the RF EM waves emitted by each of the patch antenna elements 326 in order to create a pattern of constructive and destructive interference among the entire wave front produced by the millimeter wave antenna 322. In the embodiments presented herein, the antenna front end may be communicatively coupled with a tuning module on the first PCB 324 that allows the antenna front end to adjust the current and voltage applied to the millimeter wave antenna 322 in order to adjust the frequency of RF EM waves emitted by the millimeter wave antenna 322.

In an embodiment, the first PCB 324 may be directly mechanically coupled to the metallic chassis of the information handling system such as the C-cover 308. In these embodiments, the first PCB 324 resides within a cavity formed around and behind the speaker grill 310. The cavity is created by, for example, lining a boundary of the speaker grill 310 with metallic chassis walls or plastic walls used to form an audio cavity. By placing the first PCB 324 within the cavity or nearby, electrical line routing to the first PCB 324 (i.e., containing the antenna front end and/or a tuning module) via flex cable 328 may be reduced thereby reducing any errant electromagnetic interference (EMI) from electrical wiring to the millimeter wave antenna 322. Additionally, by placing the first PCB 324 within a cavity defined by the metallic chassis walls, the cavity and speaker grill 310 as well as antennas 322 and 332 may be isolated from errant electromagnetic interference (EMI) from other electrical lines and elements placed within a remaining portion of the base chassis as well as any other EMI originating from outside the information handling system. In some embodiments, the PCB circuitry front end circuitry 324 or 330 for antennas 322 and 332 may also be inside a cavity wall for EMI isolation.

The PCB 324 may be electrically and communicatively coupled to the millimeter wave antenna 322 via a communication and power interface 328. In an embodiment, the communication and power interface 328 is a flexible flat cable or other ribbon cable that includes of a flat and flexible plastic film base with multiple flat metallic conductors bonded to one surface for connection to the millimeter wave antenna 322.

As described herein, the speaker grill 310 may have any other types of antenna elements located behind the speaker grill 310 that may be within a cavity in some embodiments. In an embodiment, the second antenna element may be the speaker grill 310 or the slot formed around the speaker grill 310. In this embodiment, an antenna 332 may be used to excite the speaker grill 310 at a connection point 344 to the speaker grill 310. The excitation of the speaker grill 310 causes the speaker grill 310 portion to radiate as a speaker grill platform antenna based on the length of the slot formed around the speaker grill 310 to form a peninsula and the voltage and current applied at the speaker grill 310. In an embodiment, the antenna 332 may be a monopole antenna capacitively coupled to a portion of the slot 324 to form an aperture antenna for sub-6 GHz frequencies. Similar to the first PCB 324, a second PCB 346 may include an antenna front end that is operatively coupled to the speaker grill platform antenna or aperture antenna at slot 318 to excite the sub-6 GHz antenna located there in order to transceive one or a plurality of frequencies based on the target frequency or a plurality of target frequencies or harmonics thereof. In the embodiments presented herein, the antenna front end may be communicatively coupled with a tuning module that allows the antenna front end to adjust the current and voltage applied to the speaker grill 310 in order to adjust the frequency to achieve an resonant frequency that the platform or the slot of the speaker grill 310 is formed to emit. The second PCB 330 may also be mechanically coupled to an interior surface of the C-cover 308. The cavity formed around and behind the speaker grill 310 may also allow for certain resonant frequencies to resonate therein. In the embodiments presented herein, the first PCB 324 and second PCB 346 may be operatively coupled to a wireless adapter. As described herein, the wireless adapter may be operatively coupled to a processor housed, with the wireless adapter, outside of the cavity that is created by walls lining a boundary of the speaker grill 310 with metallic chassis walls or plastic walls used to form an audio cavity.

In an embodiment, the speaker grill 310 may include a number of holes 342 through which sound waves from the speaker may pass. These holes 342 may be sized and spaced along the face of the speaker grill 310 with a specific pitch such that millimeter wave RF EM transmissions from the millimeter wave antenna 322 and patch elements 326 may pass therethrough as indicated by perpendicular arrows 316. In the embodiments presented herein, the speaker grill 310 may house the millimeter wave antenna 322 that emits RF EM waves in the millimeter wave ranges. Because of the relatively shorter wavelengths involved with millimeter waves, some holes 342 within the speaker grill 310 could impede the transmission of these waves. As such, the holes 342 within the speaker grill 310 define a mesh pattern that is transparent to these millimeter wave frequencies emitted by the millimeter wave antenna 322. In specific embodiments, the pitch of the holes 342 within the mesh may be 1 mm by 1 mm so as to allow for the passage of the millimeter RF EM waves. In an embodiment, the mesh pattern of the speaker grill comprises a pitch of holes 342 that are between 0.5 mm and 1.5 mm by 0.5 mm and 1.5 mm. In an example, the mesh pattern of speaker grill comprises a plurality of holes 342 defined in the speaker grill wherein the holes 342 have a diameter 336 between 0.2 mm and 0.8 mm or larger. In any embodiment, the diameter 336 of each hole as discussed in FIG. 3C and the pitch of the holes 342 formed directly above the millimeter wave antenna 322 to accommodate for the transmission of millimeter RF EM waves.

Figure 4:
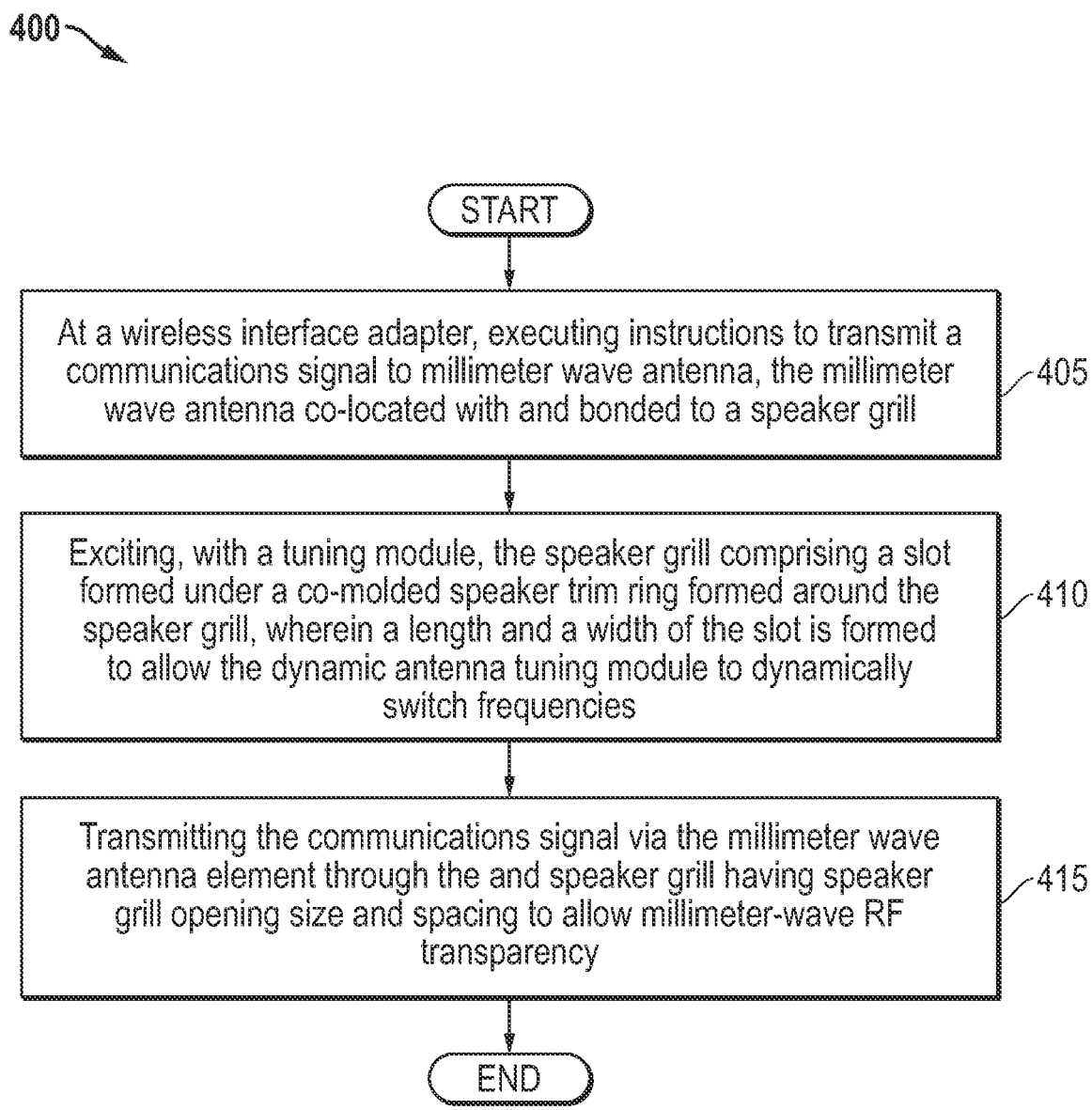
FIG. 4 is a flow diagram illustrating a method for operating an information handling system according to an embodiment of the present disclosure.

FIG. 4 is a flow diagram illustrating a method 400 for operating an information handling system according to an embodiment of the present disclosure. The method 400 may begin at block 405 with, at a wireless interface adapter, executing instructions to transmit a communications signal to a millimeter wave antenna where the millimeter wave antenna is co-located with and bonded to a speaker grill. In an embodiment, a part of the slot formed around a portion of the speaker grill may also be excited by a wireless adapter causing the emission of RF EM waves in sub-6 GHz frequencies. Thus, in these embodiments, the speaker grill may cause two separate RF EM emissions allowing for multiple types of communication with multiple networks successively or concurrently. In this example, the slot antenna formed around the speaker grill may be a 5G sub-6 GHz slot antenna tunable by a tuning module communicatively coupled to an antenna front end of the slot antenna. The millimeter wave antenna element may allow for the transmission of any millimeter wave frequencies such as 5G FR2 bands between 24,250 and 52,600 MHz. Together the slot antenna and the millimeter wave antenna element may cover a RF spectrum of between 600 MHz and 60 GHz.

The method 400, therefore, also includes at block 410, exciting, with a tuning module, the portion of the slot of the speaker grill. Again, the speaker grill includes a slot formed under a co-molded speaker trim ring formed around the speaker grill with a length and a width of the slot being formed to allow the dynamic antenna tuning module to dynamically switch frequencies. The slot antenna formed at a portion of the slot of the speaker grill may concurrently operate, in an embodiment, with the millimeter wave antenna element transceiving through the speaker grill.

The method 400 may further include transmitting the communications signal via the millimeter wave antenna element through the and speaker grill having speaker grill opening size and spacing (e.g. pitch) to allow millimeter-wave RF transparency at block 415. The millimeter wave antenna element may emit millimeter waves through the speaker grill holes. The speaker grill may include a number of holes through which sound waves from the speaker may pass. These holes may be sized and spaced out with a specific pitch such that millimeter wave RF EM transmissions may pass therethrough. In specific embodiments, the pitch of the holes within the mesh may be 1 mm by 1 mm so as to allow for the passage of the millimeter RF EM waves. In an embodiment, the mesh pattern of the speaker grill comprises a pitch of holes that are between 0.5 mm and 1.5 mm by 0.5 mm and 1.5 mm. In an example, the mesh pattern of speaker grill comprises a plurality of holes defined in the speaker grill wherein the holes have a diameter between 0.2 mm and 0.8 mm. In any embodiment, the diameter of each hole and the pitch of the holes formed directly above the millimeter wave antenna element to accommodate for the transmission of millimeter RF EM waves. The method 400 may then end.

Figure 5:
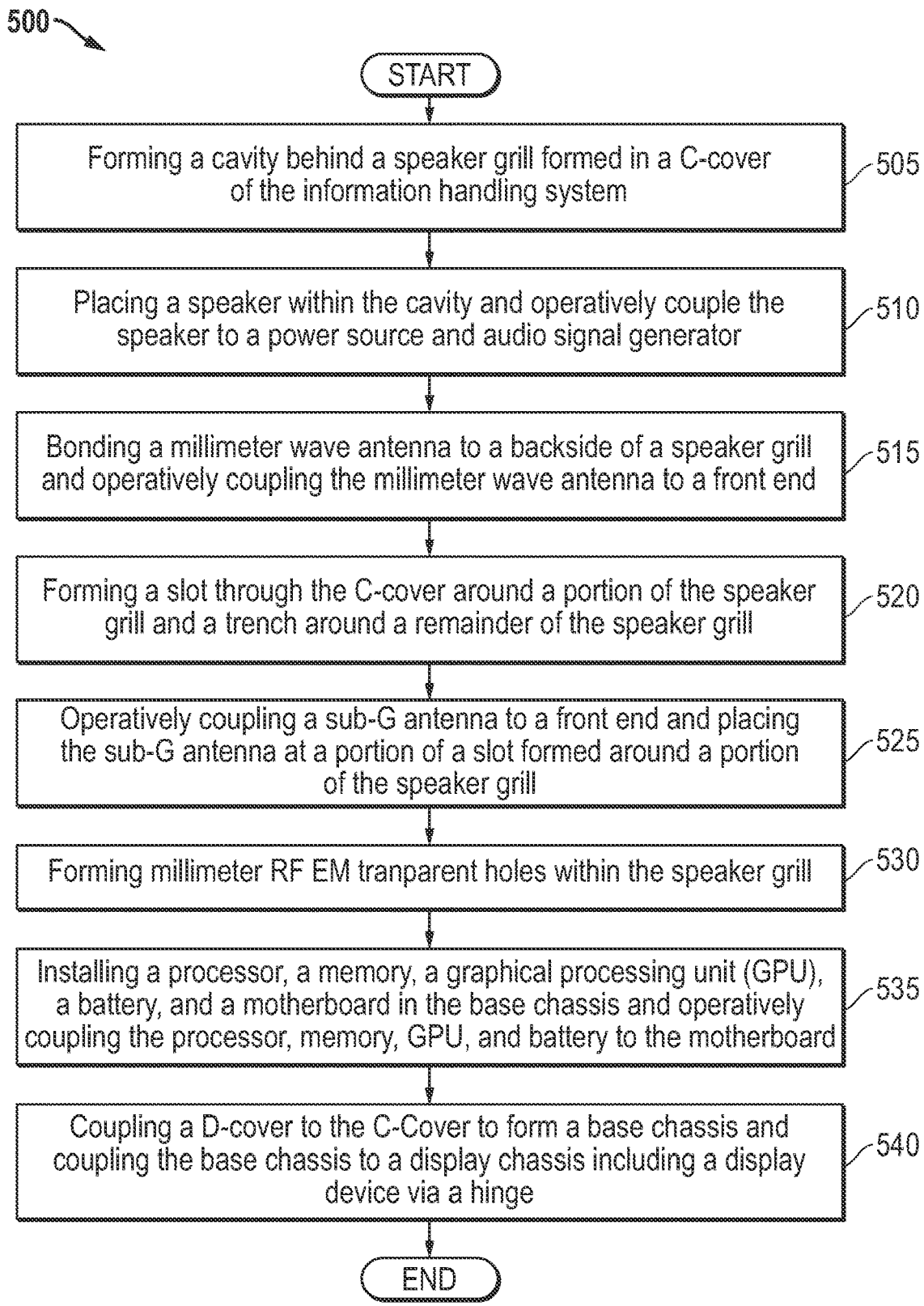
FIG. 5 is a flow diagram illustrating a method of assembling an information handling system according to an embodiment of the present disclosure.

FIG. 5 is a flow diagram illustrating a method 500 of assembling an information handling system according to an embodiment of the present disclosure. The method 500 may begin at block 505 with forming a cavity behind a speaker grill formed in a C-cover of the information handling system. The cavity may be formed using metallic chassis walls or plastic walls used to form an audio cavity. This may produce an EMI insulated cavity formed behind the speaker grill in an embodiment.

The method 500 may continue at block 510 with placing a speaker within the cavity and operatively couple the speaker to a power source and audio signal generator. The speaker may be any type of speaker that produces audio waves as output to a user of the information handling system.

The method 500, at block 515, may include bonding a millimeter antenna element to a back side of a speaker grill of an information handling system and operatively coupling the millimeter wave antenna to a front end. In an embodiment, the bonding may be achieved via any fastening device such as screws, bolts or latches. In an embodiment, the bonding of the millimeter wave antenna element to the back side of the speaker grill may be achieved via a chemical adhesive such as a glue. In an embodiment, the millimeter antenna may be formed using an array of patch millimeter wave antenna elements formed on a PCB. The millimeter wave antenna, in some embodiments, may steer the RF EM waves by, for example, controlling the phase and relative amplitude of the RF EM waves emitted by each of the patch millimeter wave antenna elements in order to create a pattern of constructive and destructive interference among the entire wave front produced by the millimeter antenna element. The millimeter antenna element may be operatively coupled to the back side of the speaker grill using, for example, an adhesive.

The method 500 may include, at block 520, forming a slot through the C-cover around a portion of the speaker grill and a trench around a remainder of the speaker grill. The method 500 also includes operatively coupling a sub-6 GHz antenna to a front end and placing the sub-6 antenna at a portion of a slot formed around a portion of the speaker grill at block 525. In this embodiment, a portion of a perimeter of the speaker grill is physical separated from a C-cover of the information handling system by a slot. The physical separation of a portion of the speaker grill from the C-cover allows for the speaker grill to be excited by a current in order to cause the edge of the speaker grill to resonant at a target frequency via the sub-6 GHz antenna element located therein or capacitively coupled to a portion of the slot. The tuning module may be part of a PCB coupled to the speaker grill via an electrical connection point. The excitation of the speaker grill may allow the portion of the slot at the edge of the speaker grill to resonate at a sub-6 GHz frequency.

The method 500 may also include, at block 530, forming millimeter RF EM transparent holes within the speaker grill. The holes may be drilled through the speaker grill or machined using other processes to form the holes. The holes formed within the speaker grill may define a mesh pattern that is transparent to the millimeter wave frequencies emitted by the millimeter wave antenna element coupled to the back side of the speaker grill. In specific embodiments, the pitch of the holes within the mesh (i.e., relative vertical and horizontal placement of the holes) may be 1 mm by 1 mm so as to allow for the passage of the millimeter RF EM waves. In an embodiment, the mesh pattern of the speaker grill comprises a pitch of holes that are between 0.5 mm and 1.5 mm by 0.5 mm and 1.5 mm. In an example, the mesh pattern of speaker grill comprises a plurality of holes defined in the speaker grill wherein the holes have a diameter between 0.2 mm and 0.8 mm. In any embodiment, the diameter of each hole and the pitch of the holes formed directly above the millimeter wave antenna element to accommodate for the transmission of millimeter RF EM waves.

The method 500 may also include, at block 535 with installing a processor, a memory, a graphical processing unit (GPU), a battery, and a motherboard in the base chassis and operatively coupling the processor, memory, GPU, and battery to the motherboard. The method 500 may also include, at block 540, with coupling a D-cover to the C-cover to form a base chassis and coupling the base chassis to a display chassis including a display device via a hinge. The method 500 may then end.

The blocks of flow diagram of FIGS. 4 and 5 discussed above need not be performed in any given or specified order. It is contemplated that additional blocks, steps, or functions may be added, some blocks, steps or functions may not be performed, blocks, steps, or functions may occur contemporaneously, and blocks, steps or functions from one flow diagram may be performed within another flow diagram.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. An information handling system to wirelessly transmit and receive data comprising:
    a base chassis including a processor, a memory, and a wireless adapter;
    a metal top cover of the base chassis to house a speaker grill, the speaker grill covering a speaker to emit audio waves; and
    the speaker grill formed in the top cover of the base chassis, the speaker grill comprising an electrically isolated portion of a perimeter of the speaker grill and a millimeter wave antenna element coupled to a back side of the speaker grill, wherein the speaker grill has a mesh pattern of grill openings sized to be transparent to millimeter wave frequencies emitted by the millimeter wave antenna element.

2. The information handling system of claim 1, further comprising:
    the speaker grill comprising a slot formed around a portion of a perimeter of the speaker grill that physically separates the portion of the speaker grill as a peninsula in the metal top cover; and
    a sub-6 GHz antenna element to transmit via the slot formed around the portion of the perimeter of the speaker grill.

3. The information handling system of claim 1, further comprising:
    a sub-6 GHz antenna element to transmit via a slot formed around a perimeter of the speaker grill.

4. The information handling system of claim 3, wherein a cavity is formed below the speaker grill to resonate a 5G frequency range 1 (FR1) frequency emitted by the sub-6 GHz antenna element.

5. The information handling system of claim 3, wherein sub-6 GHz antenna element is co-molded into the slot formed around the perimeter of the speaker grill.

6. The information handling system of claim 1, wherein the mesh pattern of grill openings for the speaker grill comprises a plurality of speaker grill openings having a pitch of holes that are between 0.5 mm and 1.5 mm by 0.5 mm and 1.5 mm.

7. The information handling system of claim 1, wherein the mesh pattern of grill openings for the speaker grill comprises a plurality of holes defined in the speaker grill wherein the holes have a diameter between 0.2 mm and 0.8 mm.

8. The information handling system of claim 7, wherein the mesh pattern of grill openings for the speaker grill comprises the plurality of holes defined in the speaker grill wherein the holes are spaced 1 mm apart.

9. The information handling system of claim 1, wherein the millimeter wave antenna element comprises an array of patch antennas mounted on a printed circuit board and communicatively coupled to a printed circuit board and operatively coupled to a bottom surface of the speaker grill.

10. A base chassis housing for an information handling system comprising:
    a speaker grill formed in a metal top cover of the base chassis housing, the speaker grill covering a speaker to emit audio waves;
    a millimeter wave antenna element coupled to a back side of the speaker grill; and
    a plurality of speaker grill openings having a mesh pattern that is transparent to millimeter wave frequencies.

11. The base chassis housing of claim 10 further comprising:
    a slot formed around a portion of a perimeter of the speaker grill that physically separates the portion of the speaker grill within the C-cover; and
    a sub-6 GHz antenna element co-molded around a perimeter of the speaker grill to transmit via the slot.

12. The base chassis housing of claim 10, further comprising:
    a sub-6 GHz antenna element to transmit via a slot formed around a perimeter of the speaker grill.

13. The base chassis housing of claim 10, wherein the mesh pattern of the speaker grill having a speaker grill opening pitch of between 0.5 mm and 1.5 mm by 0.5 mm and 1.5 mm.

14. The base chassis housing of claim 10, wherein the mesh pattern of speaker grill comprises a plurality of holes defined in the speaker grill wherein the holes have a diameter such that the speaker grill is transparent to the millimeter wave frequencies.

15. The base chassis housing of claim 10, further comprising:
    a printed circuit board operatively coupled to a bottom surface of the metal top cover and electrically coupled to the millimeter wave antenna element.

16. The base chassis housing of claim 10, wherein the millimeter wave antenna element comprises an array of patch antennas mounted under the speaker grill on a printed circuit board.

17. An information handling system to transmit a communication signal comprising:
    a processor, memory, and wireless adapter in a base chassis;
    a wireless interface adapter including a tunable front end to, upon execution of computer code at a processor, initiate communication with a network;
    a metal top cover of a base chassis to house a speaker grill, the speaker grill covering a speaker to emit audio waves;
    the speaker grill formed within the metal top cover with a slot formed around a portion of a perimeter of the speaker grill including a sub-6 GHz antenna;
    the speaker grill including a plurality of speaker grill openings with a mesh pattern that is transparent to millimeter wave frequencies and a millimeter wave antenna element coupled to a back side of the speaker grill.

18. The information handling system of claim 17, wherein the mesh pattern of the plurality of speaker grill openings of the speaker grill comprises a pitch of holes.

19. The information handling system of claim 17, wherein the sub-6 GHz antenna element is co-molded around the perimeter of the speaker grill.

20. The information handling system of claim 17, wherein the millimeter wave antenna element comprises an array of patch antennas communicatively coupled to a printed circuit board operatively coupled to a bottom surface of the metal top cover.

\* \* \* \* \*